(12) United States Patent
Seno et al.

(10) Patent No.: US 6,414,527 B1
(45) Date of Patent: Jul. 2, 2002

(54) SEMICONDUCTOR DEVICE REPLICA CIRCUIT FOR MONITORING CRITICAL PATH AND CONSTRUCTION METHOD OF THE SAME

(75) Inventors: Katsunori Seno; Takahiro Seki, both of Kanagawa; Tetsuo Kondo, Tokyo, all of (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/484,240

(22) Filed: Jan. 18, 2000

(30) Foreign Application Priority Data

Jan. 20, 1999 (JP) .......................................... 11-012381
Nov. 18, 1999 (JP) .......................................... 11-328832

(51) Int. Cl.[7] ............................................... H03L 7/06
(52) U.S. Cl. ....................................... 327/158; 327/270
(58) Field of Search ............................... 327/102, 149, 327/156, 158, 161, 540

(56) References Cited

U.S. PATENT DOCUMENTS

| | | | | |
|---|---|---|---|---|
| 4,922,141 A | * | 5/1990 | Lofgren et al. ............. | 327/158 |
| 5,537,069 A | * | 7/1996 | Volk .......................... | 327/149 |
| 5,585,754 A | * | 12/1996 | Yamashina et al. ......... | 327/158 |
| 5,900,752 A | * | 5/1999 | Mar ........................... | 327/143 |
| 5,939,913 A | * | 8/1999 | Tomita ....................... | 327/158 |
| 6,005,421 A | * | 12/1999 | Saeki ......................... | 327/119 |

* cited by examiner

Primary Examiner—Terry D. Cunningham
Assistant Examiner—Quan Tra
(74) Attorney, Agent, or Firm—Rader, Fishman & Grauer PLLC; Ronald P. Kananen, Esq.

(57) ABSTRACT

A semiconductor device provided with a replica circuit functioning as an equivalent circuit to that of a path configuration selected as a critical path in the semiconductor circuit and an adjustable delay device for example between an output side of the replica circuit and a phase comparator, the delay value of the delay device being adjustable after production of the chip to a value enabling the replica system including the replica circuit to reliably operate with a margin from the critical path delay of the semiconductor circuit, whereby it becomes possible to prevent setting of an excessive margin and becomes possible to increase the margin when the margin ends up smaller than expected and therefore it becomes possible to flexibly and efficiently configure the replica circuit, and a method of constitution of the same.

42 Claims, 19 Drawing Sheets

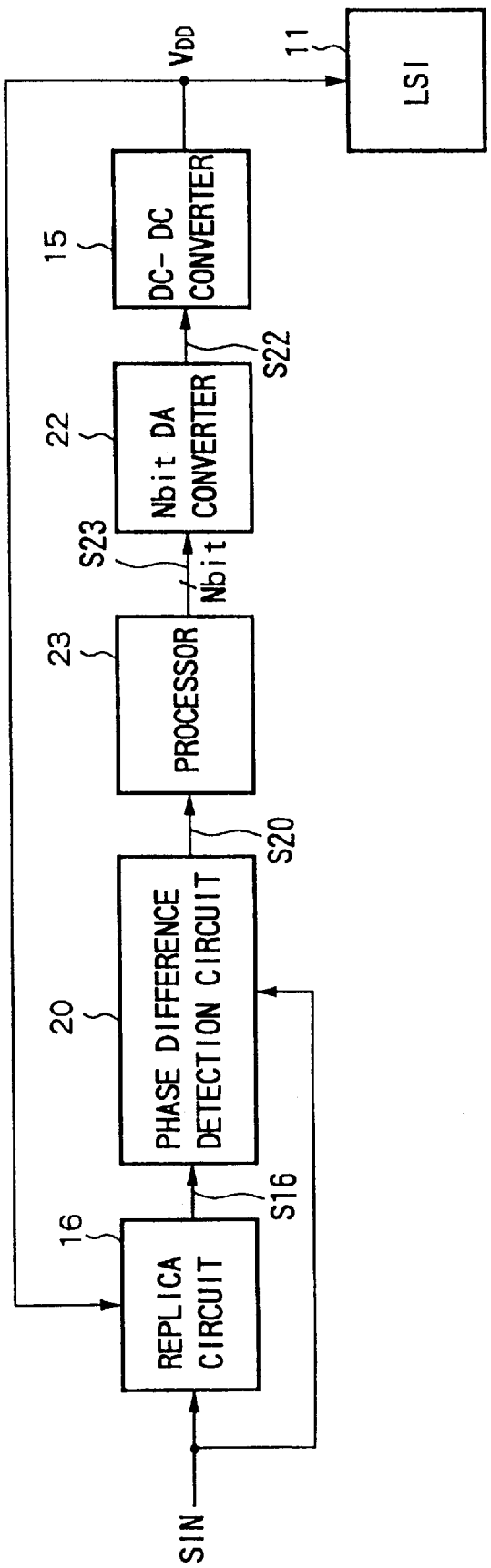

SEMICONDUCTOR DEVICE REPLICA CIRCUIT FOR MONITORING CRITICAL PATH AND CONSTRUCTION METHOD OF THE SAME

BACKGROUND OF THE INVENTION

1. Field of the Invention

The present invention relates to a semiconductor device having a replica circuit for monitoring the critical path delay of a semiconductor circuit and a method for the same.

2. Description of the Related Art

Recent semiconductor circuits generally are reduced in power consumption by the method of lowering the power source voltage VDD.

Lowering the power source voltage is the most efficient way for reducing the power consumption of a semiconductor circuit (LSI) since the AC component of the power consumption of the LSI is proportional to the square of the power source voltage.

From this viewpoint, the method has recently been reported of dynamically controlling the power source voltage to meet with the operating frequency of the LSI and handle process variations.

In a control circuit using such a method, a replica circuit having the same power source voltage-delay characteristic as a critical path of the LSI is designed and the power source voltage is controlled so that the delay of the replica circuit does not exceed one cycle of the operating frequency.

Then, as shown in FIG. 1, several delay elements 2 are added as an extra margin to the replica circuit 1 over the critical path of the chip so as to give a larger delay than that of the critical path and thereby ensure the operation.

However, in the above device of the related art, since a fixed delay margin is built in, it becomes necessary to set a larger margin in order to handle deviations of actual devices from the design stage and ensure the necessary margin. Also, there is a possibility that the margin will be smaller than expected and that malfunctions will consequently occur.

When configuring the replica circuit and margin delay portion to match with the delay value by just transistor gates, in the same way as in an RC delay based on the wiring resistance R and wiring capacity C included in the actual device, since the delay characteristics are different from those of the transistor shown in FIG. 2, it is possible that the critical path of the chip can no longer be tracked due to changes in the delay due to voltage or temperature.

When building in delay elements as in the related art, adjustment is not possible after the chip is made, so if a problem turns up in the delay value, it is necessary to fix it by a design change.

Also, the RC delay and memory delay are generally customized. Therefore, the usual automatic placement and routing and other design techniques cannot be used for unit design of replica systems and therefore there was the problem of a poorer efficiency.

Therefore, there has been a demand for a circuit configuration of a more reliable replica system enabling flexible, efficient design.

SUMMARY OF THE INVENTION

An object of the present invention is to provide a semiconductor device enabling configuration of a more reliable replica circuit flexibly and more efficiently and a method for the same.

To attain the above object, according to a first aspect of the present invention, there is provided a semiconductor device having a semiconductor circuit having a transfer path, a replica circuit for monitoring a delay time of a critical path of the semiconductor circuit, and a delay device adjustable in delay value arranged at least at one of an input side and output side of the replica circuit.

Preferably, the adjustable delay device includes delay elements having different delay characteristics. The different delay characteristics of the delay elements may be a transistor gate delay characteristic, wiring resistance and wiring capacity delay characteristic, and memory delay characteristic.

Preferably, the semiconductor device further comprises a register and a means for adjusting a delay value of the adjustable delay device based on data set in the register.

Alternatively, the semiconductor device further comprises an input terminal of an external signal and a means for adjusting a delay value of the adjustable delay device based on an external signal input to the input terminal.

Preferably, the delay elements having different delay characteristics are used as standard cells and at least one of the adjustable delay device and replica circuit is configured by arrangements of the standard cells of the delay elements.

According to a second aspect of the present invention, there is provided a semiconductor device comprising a semiconductor circuit having a transfer path, a replica circuit configured by a circuit having an equivalent power source voltage-delay characteristic to that of a transfer path used as a critical path of the semiconductor circuit and propagating a reference signal to monitor the critical path of the semiconductor device, an adjustable delay device arranged at least at one of an input side and output side of the replica circuit and capable of being adjusting in its delay value, and a voltage control circuit for generating a power source voltage of a value based on monitoring results of the replica circuit and supplying the same to the semiconductor circuit and the replica circuit.

Preferably, the adjustable delay device comprises delay elements having different delay characteristics. The different delay characteristics of the delay elements may be a transistor gate delay characteristic, wiring resistance and wiring capacity delay characteristic, and memory delay characteristic.

Preferably, the semiconductor device further comprises a register and a means for adjusting a delay value of the adjustable delay device based on data set in the register.

Alternatively, the semiconductor device further comprises an input terminal of an external signal and a means for adjusting a delay value of the adjustable delay device based on an external signal input to the input terminal.

Preferably, the delay components having different the delay elements having different delay characteristics are used as standard cells and at least one of the adjustable delay device and replica circuit is configured by arrangements of the standard cells of the delay elements.

According to a third aspect of the present invention, there is provided a semiconductor device comprising a semiconductor circuit having a transfer path and a replica circuit for monitoring a delay time of a critical path of the semiconductor circuit, the replica circuit comprising a delay device capable of being adjusted in its delay time.

Preferably, the adjustable delay device comprises delay elements having different delay characteristics. The different delay characteristics of the delay elements may be a transistor gate delay characteristic, wiring resistance and wiring capacity delay characteristic, and memory delay characteristic.

Preferably, the semiconductor device further comprises a register and a means for adjusting a delay value of the adjustable delay device based on data set in the register.

Alternatively, the semiconductor device further comprises a register and a means for adjusting a delay value of the adjustable delay device based on data set in the register.

According to a fourth aspect of the present invention, there is provided a semiconductor device comprising a semiconductor circuit having a transfer path and a replica circuit for propagating a reference signal to monitor a delay time of a critical path of the semiconductor circuit, the replica circuit comprising a plurality of replica portions including delay devices, a connection selecting means for connecting the plurality of replica portions in parallel or in series with respect to an input of the reference signal upon receiving a selection signal, and a selecting means for selecting as a monitor signal an output signal of the largest delay amount from outputs of the plurality of replica portions.

Preferably, the delay devices comprise delay elements having different delay characteristics and are capable of being adjusted in delay values by settings. The different delay characteristics of the delay elements may be a transistor gate delay characteristic, wiring resistance and wiring capacity delay characteristic, and memory delay characteristic.

Preferably, the semiconductor device further comprises a register, the connection selecting means connecting the plurality of replica portions in parallel or in series based on data set in the register.

Alternatively, the semiconductor device further comprises a register and a means for adjusting a delay value of an adjustable delay device based on data set in the register.

Alternatively, the semiconductor device further comprises an input terminal of an external signal, the connection selecting means connecting the plurality of replica portions in parallel or in series based on the external signal input to the input terminal.

Alternatively, the semiconductor device further comprises an input terminal of an external signal and a means for adjusting a delay value of an adjustable delay device based on an external signal input to the input terminal.

According to a fifth aspect of the present invention, there is provided a semiconductor device comprising a semiconductor circuit having a transfer path, a replica circuit having an equivalent power source voltage-delay characteristic to that of a transfer path used as a critical path of the semiconductor circuit, configured by a delay device capable of being adjusted in its delay value, and propagating a reference signal to monitor the critical path of the semiconductor device, and a voltage control circuit for generating a power source voltage of a value based on monitoring results of the replica circuit and supplying it to the semiconductor circuit and the replica circuit.

Preferably, the adjustable delay device comprises delay elements having different delay characteristics. The different delay characteristics of the delay elements may be a transistor gate delay characteristic, wiring resistance and wiring capacity delay characteristic, and memory delay characteristic.

Preferably, the semiconductor device further comprises a register and a means for adjusting a delay value of the adjustable delay device based on data set in the register.

Alternatively, the semiconductor device further comprises an input terminal of an external signal and a means for adjusting a delay value of the adjustable delay device based on an external signal input to the input terminal.

According to a sixth aspect of the present invention, there is provided a semiconductor device comprising a semiconductor circuit having a transfer path, a replica circuit comprising a plurality of replica portions each having an equivalent power source voltage-delay characteristic to that of a transfer path used as a critical path of the semiconductor circuit and including a delay device, a connection selecting means for connecting the plurality of replica portions in parallel or in series with respect to an input of the reference signal upon receiving a selection signal, and a selecting means for selecting as a monitor signal an output signal of the largest delay amount from outputs of the plurality of replica portions, for propagating the reference signal to monitor the critical path of the semiconductor device, and a voltage control circuit for generating a power source voltage of a value based on monitoring results of the replica circuit and supplying the same to the semiconductor circuit and the replica circuit.

Preferably, each delay device comprises delay elements having different delay characteristics and is capable of being adjusted in its delay value by settings. The different delay characteristics of the delay elements may be a transistor gate delay characteristic, wiring resistance and wiring capacity delay characteristic, and memory delay characteristic.

Preferably, the semiconductor device further comprises a register and a means for adjusting a delay value of an adjustable delay device based on data set in the register.

Alternatively, the semiconductor device further comprises an input terminal of an external signal, the connection selecting means connecting the plurality of replica portions in parallel or in series based on an external signal input to the input terminal.

According to a seventh aspect of the present invention, there is provided a method for configuring a semiconductor device comprising a semiconductor device having a transfer path and a replica circuit for monitoring a delay time of a critical path of the semiconductor circuit, including the steps of arranging a delay device capable of being adjusted in its delay value at least at one of an input side and output side of the replica circuit and inside of the replica circuit and adjusting a delay value of the delay device to a value enabling operation with a margin from a critical path delay of the semiconductor circuit after being produced.

According to an eighth aspect of the present invention, there is provided a method of configuring a semiconductor device comprising a semiconductor circuit having a transfer path and a replica circuit for monitoring a delay time of a critical path of the semiconductor circuit, including the steps of forming the replica circuit by a delay device capable of being adjusted in its delay value and adjusting the delay value of the delay device to a value enabling operation with a margin from a critical path delay of the semiconductor circuit after being produced.

According to a ninth aspect of the present invention, there is provided a method of configuring a semiconductor device comprising a semiconductor circuit having a transfer path and a replica circuit for monitoring a delay time of a critical path of the semiconductor circuit, including the steps of forming the replica circuit by a plurality of delay devices capable of being adjusted in delay value and connecting the plurality of delay devices in parallel or in series after being produced to adjust the delay values of the delay devices to values enabling operation with a margin from a critical path delay of the semiconductor circuit.

Preferably, the delay devices are formed to be able to be adjusted in delay value and the delay values of the delay devices are set after production.

BRIEF DESCRIPTION OF THE DRAWINGS

These and other objects and features of the present invention will become clearer from the following description of the preferred embodiments given with reference to the accompanying drawings, in which:

FIG. 24 is a block diagram of a ninth embodiment of a semiconductor device using a replica circuit according to the present invention.

DESCRIPTION OF THE PREFERRED EMBODIMENTS

Below, preferred embodiments will be described with reference to the accompanying drawings.

First Embodiment

Figure 1:
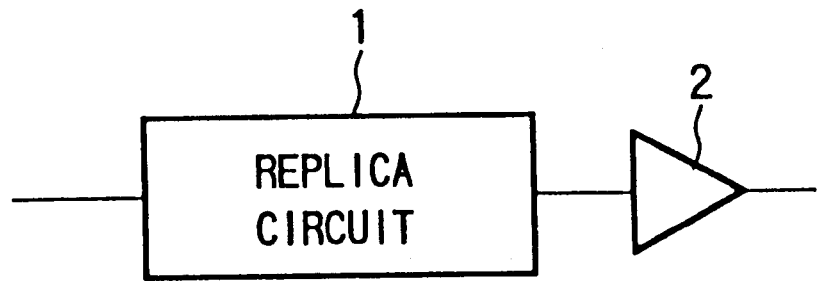
FIG. 1 is a view of a replica circuit connected to a delay element of a fixed delay margin.
Figure 2:
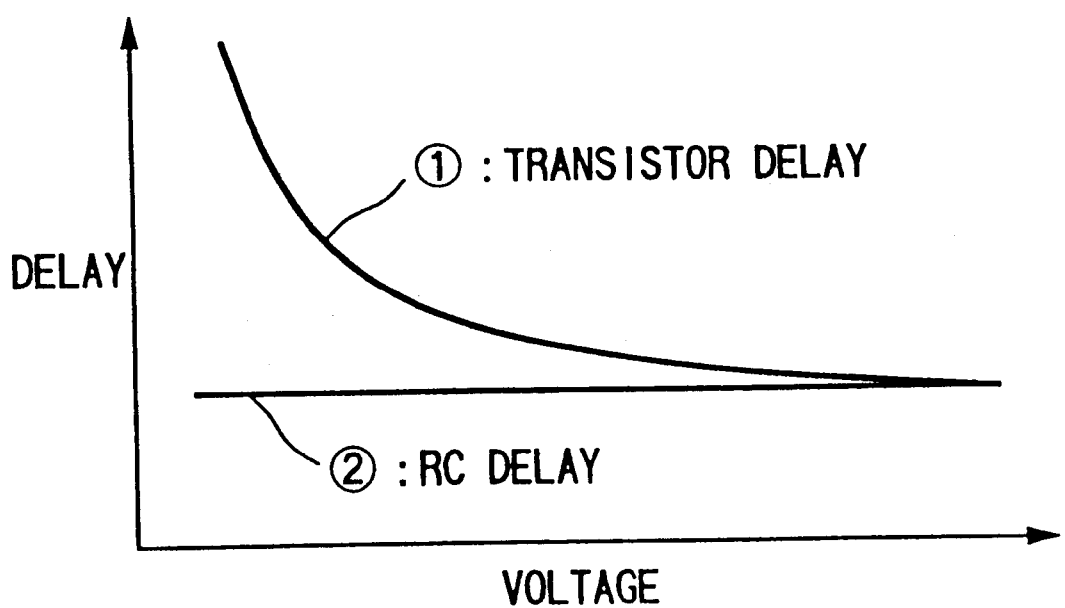
FIG. 2 is a view of a voltage dependency of a transistor delay and RC delay.
Figure 3:
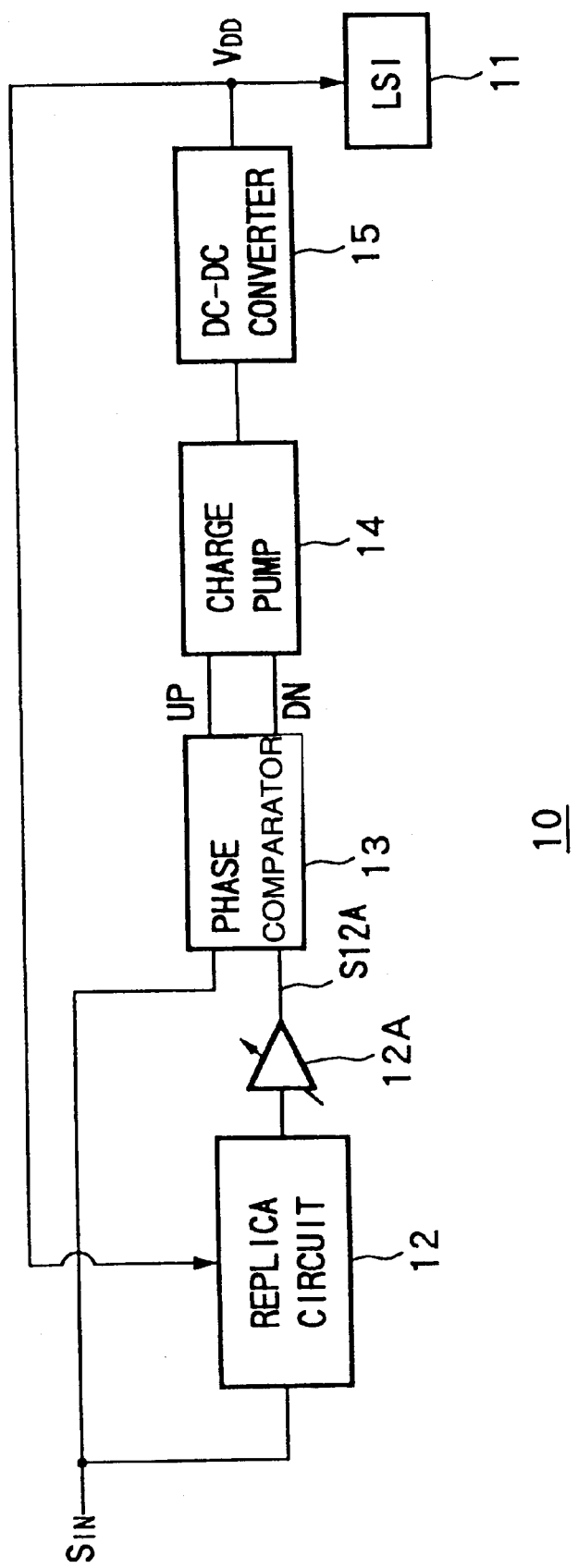
FIG. 3 is a block diagram of a first embodiment of a semiconductor device using a replica circuit according to the present invention.

FIG. 3 is a block diagram of a first embodiment of a semiconductor device using a replica circuit according to the present invention.

In the illustrated example, the present semiconductor device applies the replica circuit to a power source voltage control circuit for dynamically changing a power source voltage VDD of a semiconductor circuit so as constantly supply the lowest operating voltage.

The present semiconductor device 10 comprises a semiconductor circuit (LSI) 11, a replica circuit 12, an adjustable delay device 12A, a phase comparator 13, a charge pump 14, and a DC-DC converter 15.

A voltage control circuit is configured by the phase comparator 13, the charge pump 14, and the DC-DC converter 15.

Figure 4:
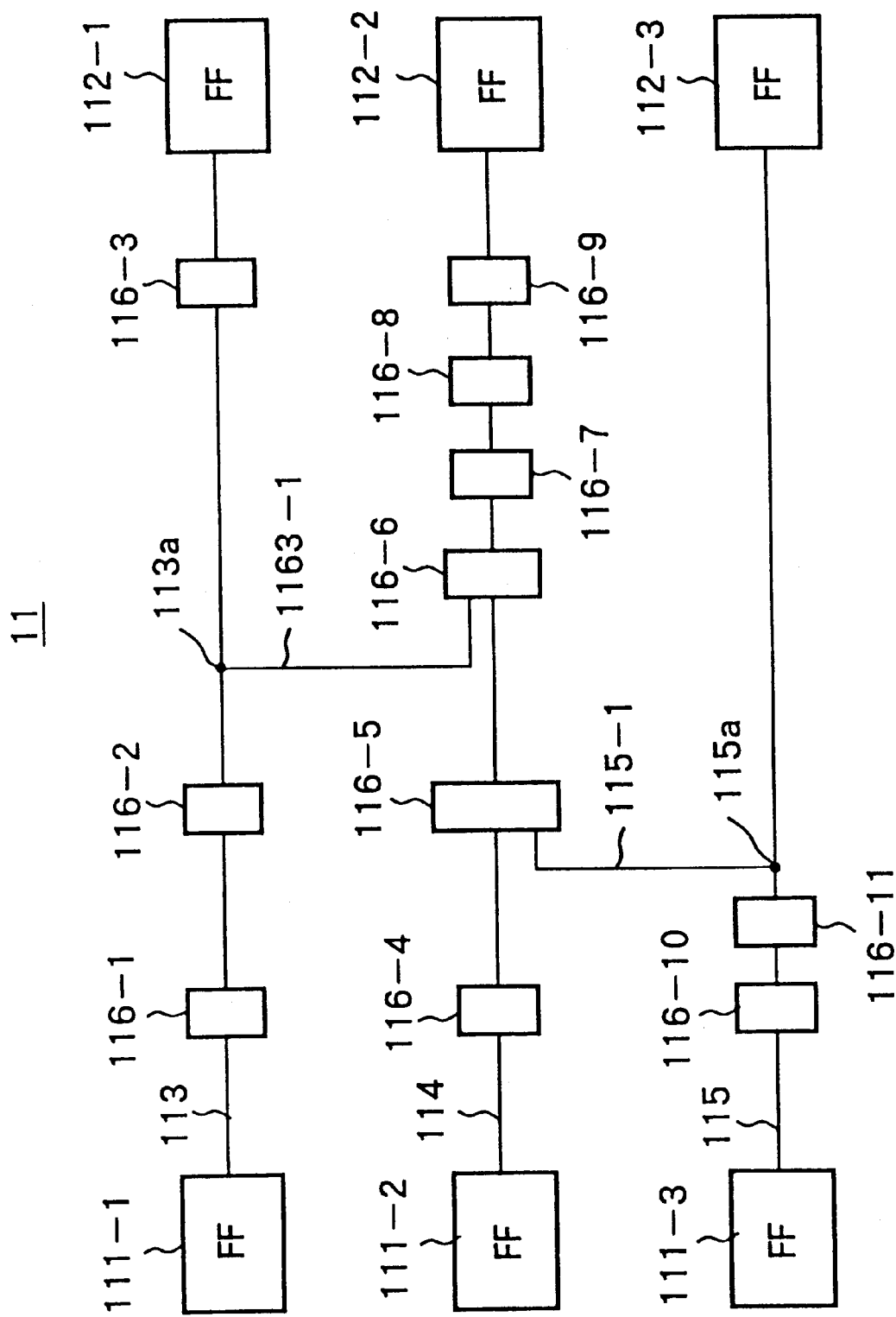
FIG. 4 is a circuit diagram of an example of the configuration of a semiconductor circuit according to the present invention.

The semiconductor circuit 11 is supplied with the power source voltage VDD from the DC-DC converter 15 and is, for example, a synchronization circuit having a plurality of transfer paths as shown in FIG. 4 and comprising flip-flops (FF) 111-1, 111-2, and 111-3 on a signal transmitting side, flip-flops 112-1, 112-2 and 112-3 on a receiving side, main transfer paths 113, 114, and 115 for connecting the flip-flops on the transmitting side and the receiving side, branching paths 113-1 and 118-1, and gate elements 116-1 to 116-11 as transfer elements having a predetermined threshold voltage.

The main transfer path 113 is connected between an output of the signal transmitting side flip-flop 111-1 and an input of the receiving side flip-flop 112-1. A branch path 113-1 is branched from a branching point 113a of the main transfer path 113, and the branch path 113-1 is connected to one input terminal of the gate element 116-6.

Gate elements 116-1 and 116-2 are arranged on the main transfer path between the output of the flip-flop 111-1 and the branching point 113a, while a gate element 116-3 is arranged on the main transfer path 113 between the branching point 113a and the input of the receiving side flip-flop 112-1.

The main transfer path 114 is connected between an output of the signal transmitting side flip-flop 111-2 and an input of the receiving side flip-flop 112-2.

Gate elements 116-4 to 116-9 are arranged on the main transfer path 114 between the output of the flip-flop 111-2 and the input of the flip-flop 112-2.

Specifically, one input of the gate element 116-5 is connected to an output of the gate element 116-4, an output of the gate element 116-5 is connected to the other input of the gate element 116-6, and gate elements 116-7 to 116-9 are connected to the output side of the gate element 116-6.

The main transfer path 115 is connected between an output of the signal transmitting side flip-flop 111-3 and an input of the receiving side flip-flop 112-3. A branch path 115-1 is branched from a branching point 115a of the main transfer path 115, and the branch path 115-1 is connected to other input terminal of the gate element 116-5.

Gate elements 116-10 and 116-11 are arranged on the main transfer path 115 between the output of the flip-flop 111-3 and the branching point 115a.

Note that the gate elements 116-1 to 116-11 are configured by using, for example, insulating gate type field effect transistors, that is, metal insulator semiconductor (MIS) circuits, In a synchronization semiconductor circuit 11 of FIG. 3, the delay path giving the largest delay value (critical path) is the transfer path of the flip-flop 111-3→the main transfer path 115→the gate elements 116-10 and 116-11→the branch path 115-1→the gate element 116-5→the main transfer path 114→the gate elements 116-6 to 116-9→the flip-flop 112-2.

Accordingly, principally, the replica circuit 12 is configured based on the elements and paths comprising this path.

The replica circuit 12 is configured as a circuit having an equivalent power source voltage-delay characteristic as that of the path configuration selected as the critical path as explained above in the semiconductor circuit 11. It operates receiving the power source voltage $V_{DD}$ from the DC-DC converter 15 and receives as input, performs gate processing on, and propagates a reference signal SIN of a predetermined cycle.

The replica circuit 12 is, taking the case of FIG. 4 as an example, configured by an equivalent circuit to the flip-flop 111-3→the main transfer path 115→the gate elements 116-10 and 116-11→the branch path 115-1 the gate element 116-5→the main transfer path 114→the gate elements 116-6 to 116-9→the flip-flop 112-2.

In the first embodiment, a delay device 12A adjustable in delay amount is connected to the output side of the replica circuit 12.

Upon receiving an adjustment signal SADJ, the adjustable delay device 12A is adjusted in its delay value to a value by which the replica system including the replica circuit 12 reliably operates with a margin from the critical delay of the semiconductor circuit (LSI) 11. It propagates the outputs signal of the replica circuit 12 with this delay value and outputs the propagated signal as a delay signal S12A to the phase comparator 13.

Note that, in the example of FIG. 3, the position of arrangement of the delay device 12A is the output side of the replica circuit 12, however, the positional relationship of the replica circuit 12 and the delay device 12A is not limited to this. The delay device 12A may be arranged, for example, at the input side of the replica circuit 12 or inside the replica circuit 12.

Figure 5:
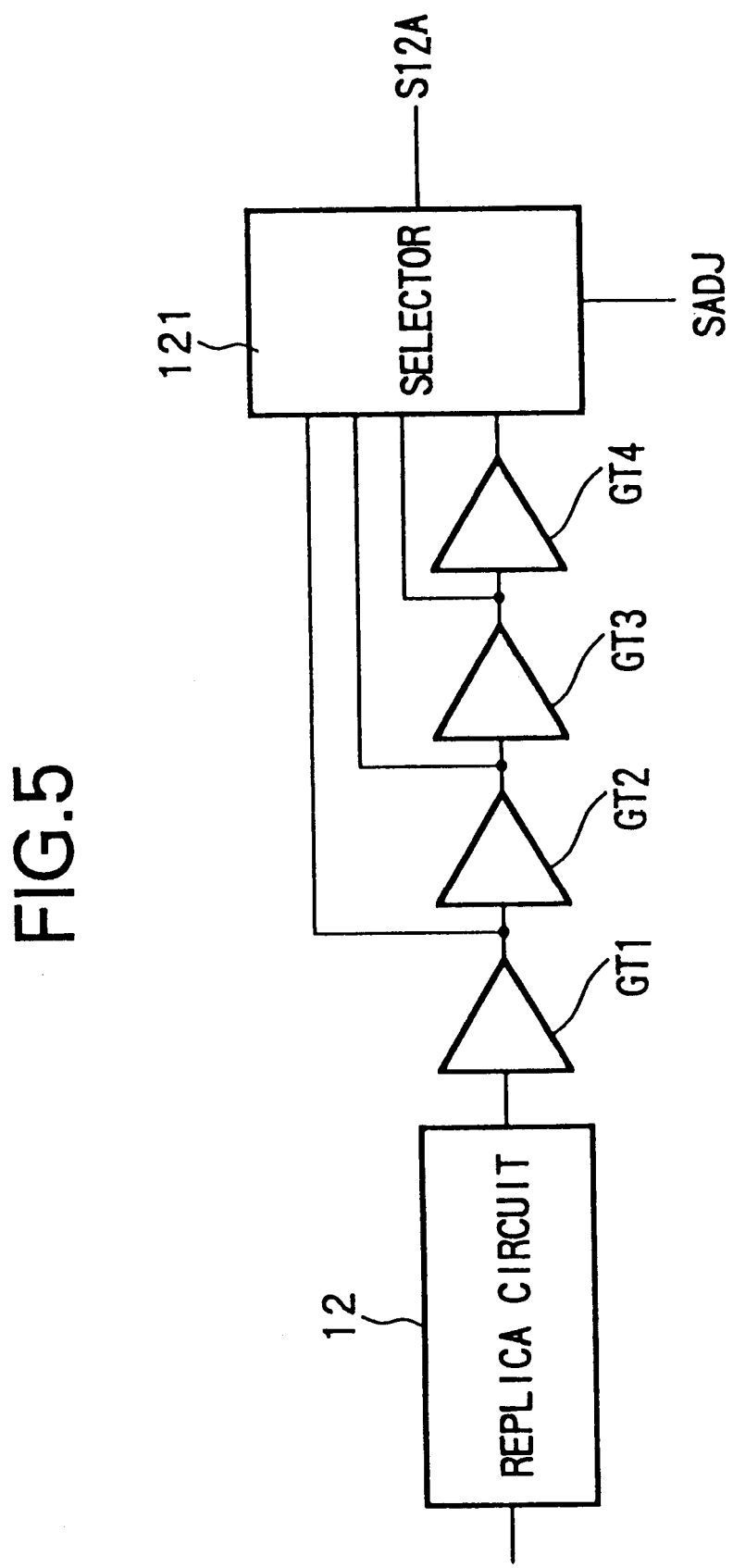
FIG. 5 is a circuit diagram of an example of the configuration of an adjustable delay device according to the present invention.

FIG. 5 is a circuit diagram of an example of the configuration of the adjustable delay device.

The delay device 12A comprises, as shown in FIG. 5, delay gates GT1 to GT4 and a selector 121.

The selector 121 has connected to it the respective output terminals of the delay gates GT1 to GT4 and selects an output signal of the gate of a different delay amount according to an adjustment signal SADJ supplied. As a result, it is possible to adjust the gate to a necessary margin delay value.

The selector 121 outputs the selected delay device output as a delay signal S12A.

The adjustable delay device 12A is supplied with the adjustment signal SADJ by a predetermined method, for example, after the chip is produced, to set it to a desired value.

Figure 6:
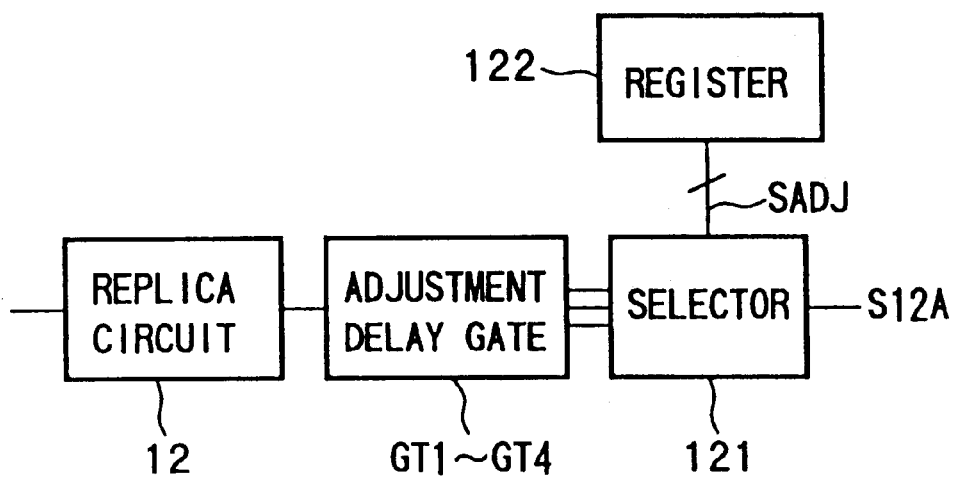
FIG. 6 is a circuit diagram of an example of the configuration for supplying an adjustment signal to a selector connected to an adjustable delay device according to the present invention.
Figure 7:
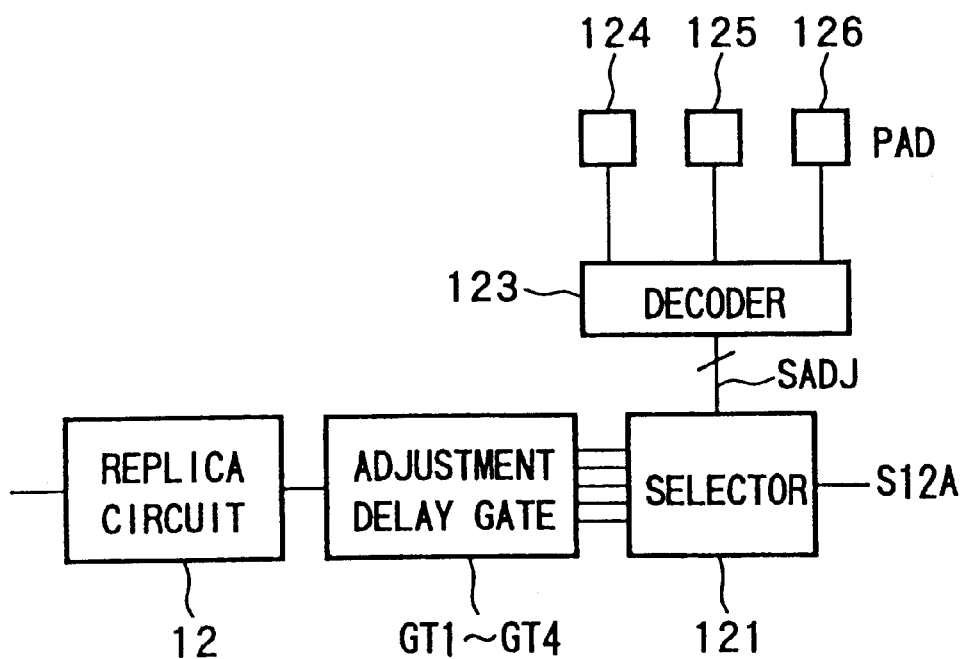
FIG. 7 is a circuit diagram of another example of the configuration for supplying an adjustment signal to a selector connected to an adjustable delay device according to the present invention.

The adjustment signal SADJ can be supplied, for example, by the configurations shown in FIGS. 6 and 7.

The configuration shown in FIG. 6 is an example of using a register 122.

Namely, it is an example of the configuration where the register is for example directly accessed from the outside by direct memory access (DMA) or delay value (gate output) data to be selected is set from some sort of internal control circuit and given as the adjustment signal SADJ.

The configuration shown in FIG. 7 is an example of controlling the selector 121 by a signal setting to external pins (input terminals of an external signal) 124, 125, and 126 via a decoder 123.

Note that it is obvious that the present invention includes a case without the decoder 123. Also, the present invention is not limited to the above configuration examples.

The phase comparator 13 compares the phase of a reference signal SIN and that of the output delay signal S12A of the delay device 12A, generates an up signal UP when the delay signal S12A is delayed by one cycle or more from the reference signal SIN, generates a down signal DN when it is advanced by one cycle or more, and outputs the signal to the charge pump 14.

The charge pump 14 outputs to the DC-DC converter 15 a signal S14 for instructing an increase of the power source voltage VDD by the DC-DC converter 15 when receiving the up signal UP from the phase comparator 13 or a decrease of the power source voltage VDD by the DC-DC converter 15 when receiving the down signal DN.

The DC-DC converter 15 receives the output signal S14 of the charge pump 14, adjusts the value of the power source voltage VDD as instructed by the signal S14, and supplies the voltage to the semiconductor circuit 11 and the replica circuit 12.

Next, the operation by the above configuration will be explained.

The replica circuit 12 is configured as a circuit having an equivalent delay characteristic to that of the path configuration selected as the critical path in the semiconductor circuit 11. The adjustable delay device 12A is provided, for example, between the output side of the replica circuit 12 and the phase comparator 13.

For example, after producing the chip, the adjustment signal SADJ is given to the selector 121 of the delay device 12A via the register 122 or the decoder 123.

As a result, upon receiving the adjustment signal SADJ, the delay value of the delay device 12A is adjusted to the value by which the replica system including the replica circuit 12 reliably operates with a margin from the critical path delay of the semiconductor circuit (LSI) 11.

In such a semiconductor device adjusted in delay value, the reference signal SIN of a predetermined cycle is input to the replica circuit 12. Then, the reference signal SIN is delayed by a predetermined time by the gate processing etc. in the replica circuit 12, is further delayed by a set amount in the delay device 12A adjusted in delay value, and is output as a delay signal S12A to the phase comparator 13.

In the phase comparator 13, the reference signal SIN and the output delay signal S12A of the delay device 12A are input and the phases of the two signals are compared.

When the result of the comparison is that the delay signal S12A is delayed by one cycle or more from the reference signal SIN, an up signal UP is generated and output to the charge pump 14.

On the other hand, when the delay signal S12A is advanced by one cycle or more from the reference signal SIN, a down signal DN is generated and output to the charge pump 14.

In the charge pump 14, when receiving the up signal UP from the phase comparator 13, a signal S14 for instructing an increase of the power source voltage $V_{DD}$ by the DC-DC converter 15 to increase the processing speed (to make the delay smaller) is generated and output to the DC-DC converter 15.

On the other hand, when receiving the down signal DN from the phase comparator 13, a signal S14 for instructing a decrease of the power source voltage $V_{DD}$ by the DC-DC converter 15 to decrease the processing speed (to make the delay larger) is generated and output to the DC-DC converter 15.

In the DC-DC converter 15, upon receipt of the output signal S14 from the charge pump 14, the power source voltage $V_{DD}$ is adjusted in value as instructed by the signal S14 and supplied to the semiconductor circuit 11 and the replica circuit 12.

As explained above, according to the first embodiment, since the replica circuit 12 is configured as a circuit having an equivalent delay characteristic to that of the path configuration selected as the critical path in the semiconductor circuit 11, an adjustable delay device 12A is provided, for example, between the output side of the replica circuit 12 and the phase comparator 13, and for example, after producing the chip, the delay value of the delay device 12A can be adjusted to a value by which the replica system, including the replica circuit 12, reliably operates with a margin from the critical path delay of the semiconductor circuit (LSI) 11, setting of an excessively large margin can be prevented and erroneous operation when the margin is smaller than expected can be prevented by increasing the margin.

Also, by enabling a change of the delay value of the adjustable delay device 12A by setting the register and external pins, there is the advantage that the delay value and margin can be adjusted after producing the chip.

Note that in the above explanation, an example of configuring the adjustable delay device 12A by delay gates GT1 to GT4 and selector 121 as shown in FIG. 5 was given, however, the configuration of the delay device is not limited to this. Various modifications are possible.

Figure 8:
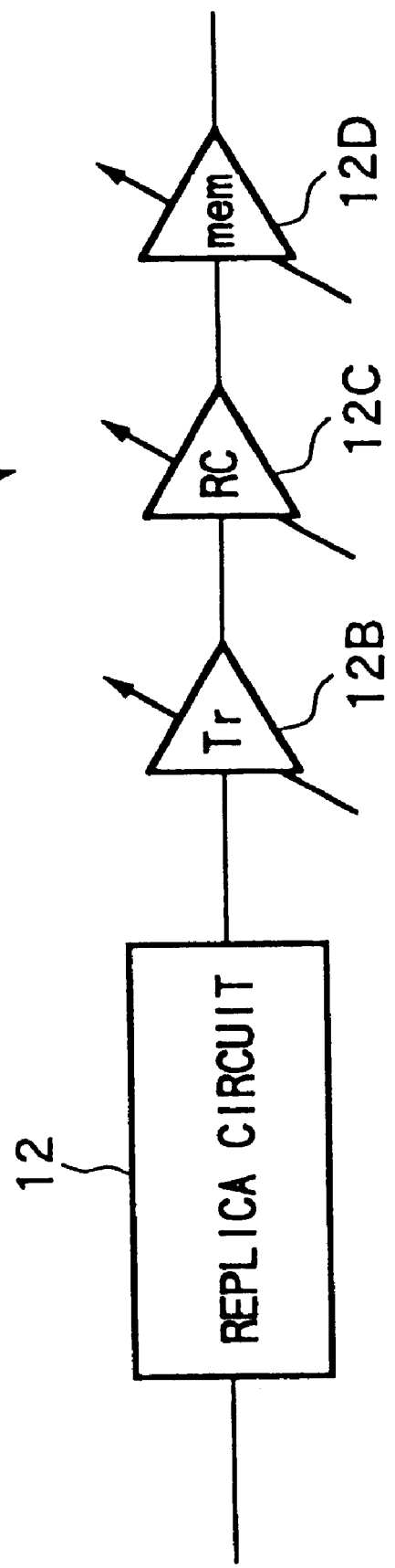
FIG. 8 is a conceptual view of a case where the adjustable delay device according to the present invention comprises delay elements having different delay characteristics such as transistor gate delay, RC delay, and memory delay.

For example, as shown in FIG. 8, the adjustable delay device 12A can be configured by delay elements having different characteristics such as transistor delay, RC delay, and memory delay characteristics.

In FIG. 8, 12B indicates an adjustable delay device having a delay characteristic the same as a transistor delay, 12C indicates an adjustable delay device having an RC delay characteristic in the same way, and 12D indicates an adjustable delay device having a memory delay characteristic.

Figure 9:
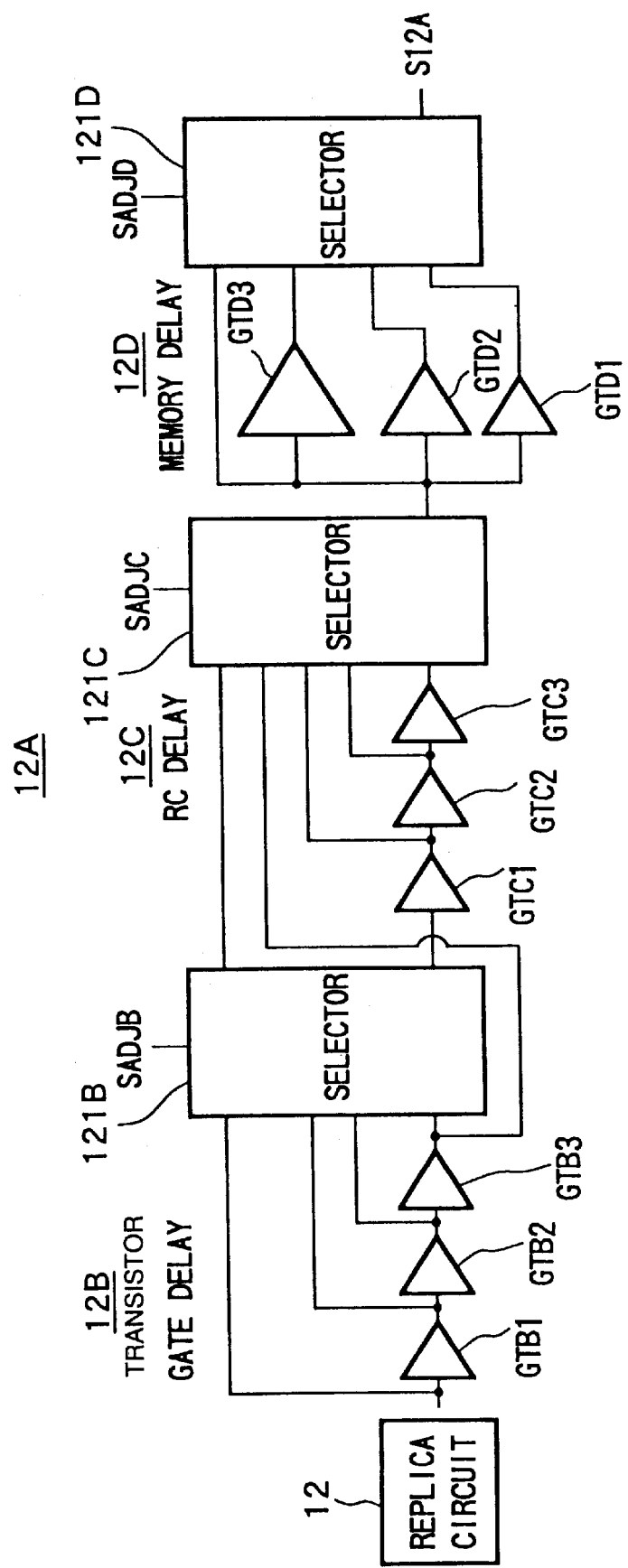
FIG. 9 is a circuit diagram of an example of the configuration of delay gates having different delay characteristics.

FIG. 9 is a circuit diagram of a specific example of the configuration of a delay device comprised of delay elements of different delay characteristics.

As shown in FIG. 9, the adjustable delay device 12B having a delay characteristic the same as transistor gate delay is configured by delay gates GTB1 to GTB3 connected in series and a selector 121B.

The selector 121B has connected to it the respective output terminals of the delay gates GTB1 to GTB3 and an output terminal of the replica circuit 12 and selects an output signal of a gate of a different delay amount in accordance with an adjustment signal SADJB supplied.

Figure 10:
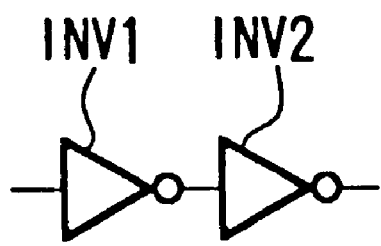
FIG. 10 is a circuit diagram of an example of the configuration of delay gates having a transistor delay characteristic.

Note that the delay gates GTB1 to GTB3 having the transistor delay characteristics are each, for example, as shown in FIG. 10, configured by a buffer comprised of two inverters INV1 and INV2 connected in series.

The adjustable delay device 12C having the RC delay characteristic is configured by delay gates GTC1 to GTC3 connected in series and selector 121C.

The selector 121C has connected to it the respective output terminals of the delay gates GTC1 to GTC3, an output terminal of the delay gate GTB3 of the delay device 12B, and an output terminal of the replica circuit 12 via the selector 121B and selects an output signal of the delay device 12B of a different delay amount in accordance with the adjustment signal SADJC supplied.

Figure 11:
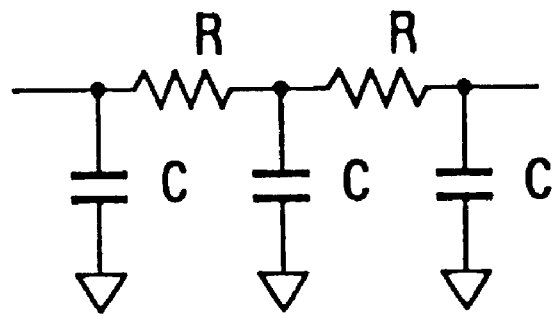
FIG. 11 is a circuit diagram of an example of the configuration of delay gates having an RC delay characteristic.

Note that the delay gates GTC1 to GTC3 having the RC delay characteristics are each configured, for example, by a so-called RC unit as shown in FIG. 11.

The delay device 12D having the memory delay characteristic is configured by delay gates GTD1 to GTD3 connected in parallel and a selector 121D.

The selector 121D has connected to it the respective output terminals of the delay gates GTD1 to GTD3 and an output terminal of the selector 121C of the delay device 12C and selects an output signal of the delay device 13 of a different delay amount in accordance with the adjustment signal SADJD supplied.

Figure 12A:
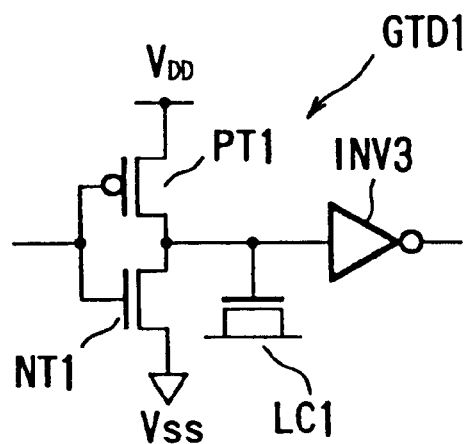
FIGS. 12A to 12C are circuit diagrams of specific examples of configurations of delay devices comprised of delay elements of different characteristics.
Figure 12B:
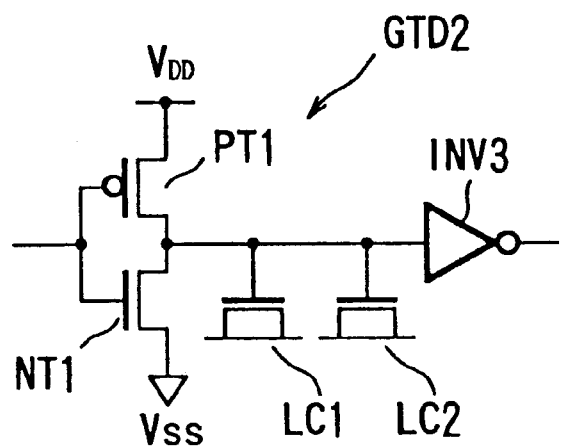
Figure 12C:
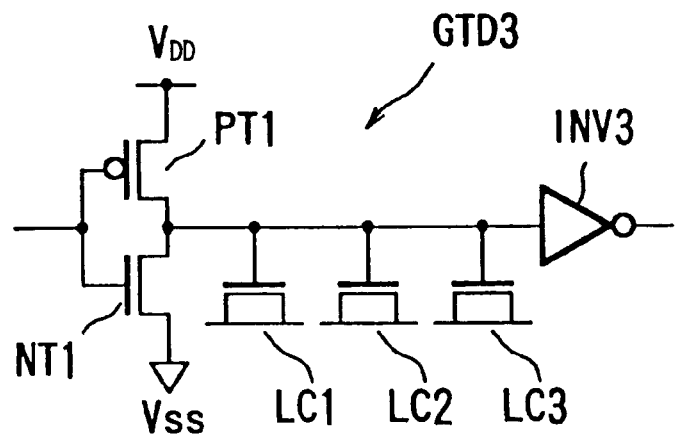

Note that the delay gates GTD1 to GTD3 having the memory delay characteristics are, as shown in FIGS. 12A to 12C, configured to enable selection of values of loads changed using units emulating the discharge characteristics of bit lines.

Basically, the delay gate GTD1 comprises, as shown in FIG. 12A, a p-channel MOS (PMOS) transistor PT1 and an n-channel MOS (NMOS) transistor NT1 connected between a supply line of a power source voltage $V_{DD}$ and a ground line, an inverter INV3, and a load capacity LC1 comprised by connecting a source and drain of the NMOS transistor.

Further, as shown in FIG. 12B, the delay gate GTD2 is configured by increasing the load capacity by one, while as shown in FIG. 12C, the delay gate GTD3 is configured by further increasing the load capacity by one.

The delay device configured in this way uses the adjustment signals SADJB, SADJC, and SADJD to the respective selectors 121B, 121C, and 121D to selectively combine the amounts of delay so as to adjust the delay and adjust the margin from the critical path of the actual device.

By configuring the delay device by delay elements of different delay characteristics in this way and using them to adjust the delay value and the characteristics, there is an advantage that it is possible to prevent the inability of tracking due to changes in the voltage or temperature and the resultant defective chip.

Note that the configuration of the delay elements is not limited by the above configuration. Further, the delay elements are not limited to the three kinds of the transistor delay, RC delay, and memory delay. Transistor delays of a variety of circuit configurations can also be used.

Figure 13:
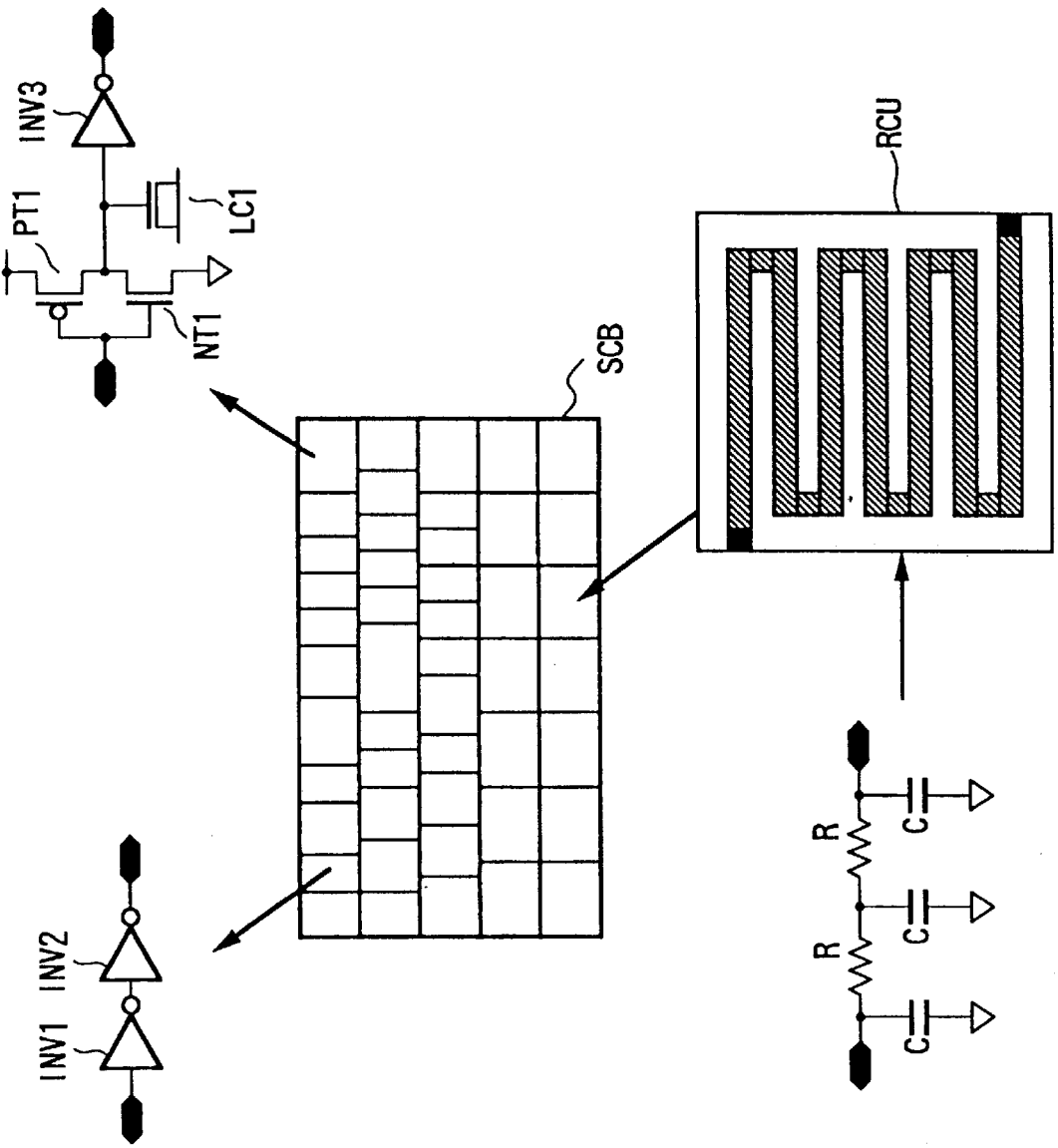
FIG. 13 is a view for explaining an example where delay elements of different delay characteristics are treated as standard cells.

As shown in FIG. 13, it is possible to use the above delay elements of different delay characteristics as standard cells.

In FIG. 13, SCB indicates a standard cell block.

Also, for example, an RC delay unit RCU is configured by a predetermined pattern. A desired RC delay can be obtained by using a plurality of such RC delay units RCU.

By using delay units of different critical paths and delay characteristics as standard cells in this way, there are the advantages that it becomes possible to design delay units by using automatic placement and routing using ordinary CAD and, in turn, the efficiency of the design is improved.

Second Embodiment

Figure 14:
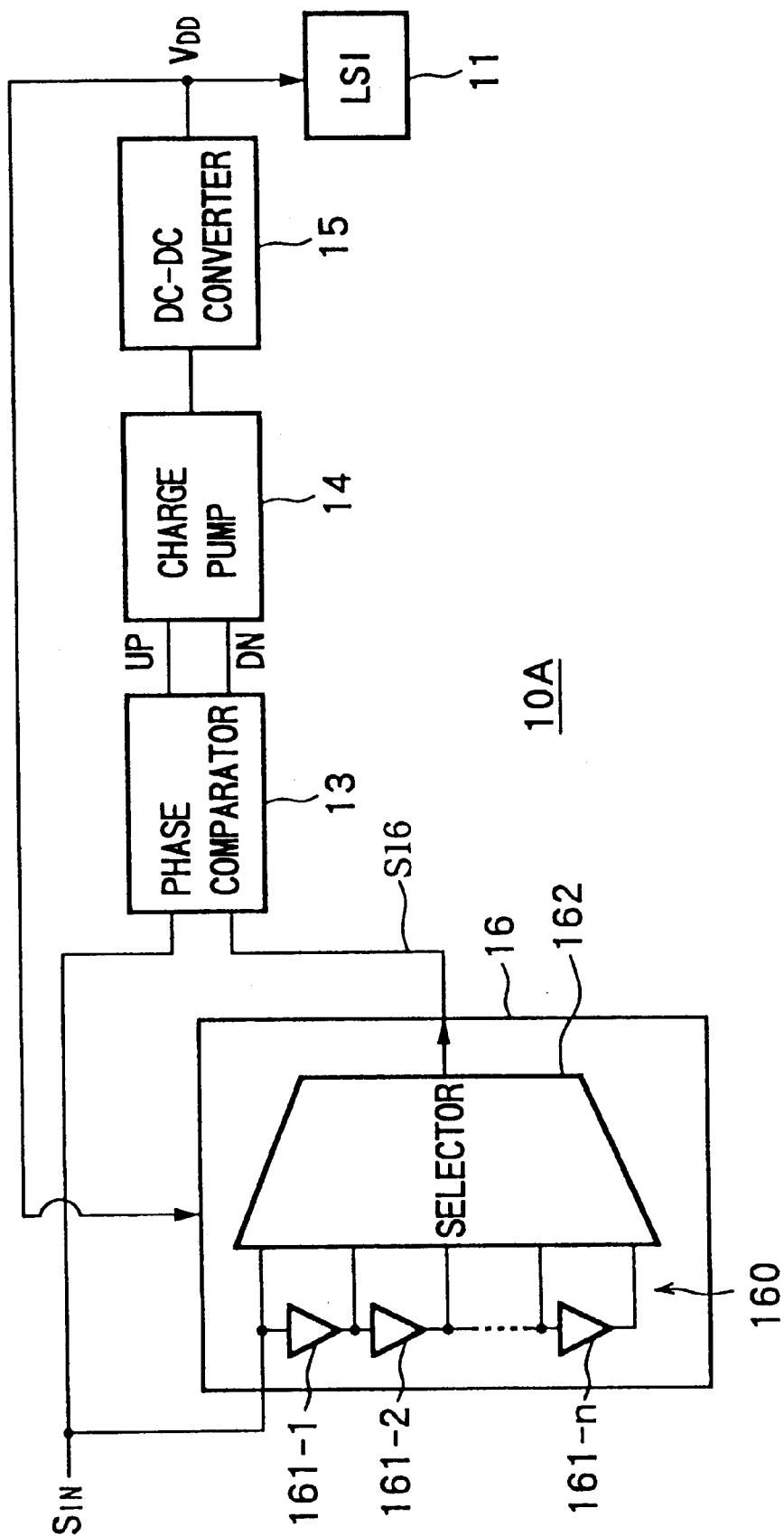
FIG. 14 is a block diagram of a second embodiment of a semiconductor device using a replica circuit of the present invention.

FIG. 14 is a block diagram of a second embodiment of a semiconductor device using a replica circuit according to the present invention.

The semiconductor device according to the second embodiment, in the same way as in the semiconductor device according to the first embodiment, uses the replica circuit for a power source voltage control circuit for dynamically changing the power source voltage $V_{DD}$ of the semiconductor circuit so as to constantly supply the lowest operating voltage.

The second embodiment differs from the above first embodiment in the point that instead of separately arranging the adjustable delay device outside the replica circuit (at an output side of the replica circuit in the first embodiment), it uses a replica circuit 16 comprised of an adjustable delay device 160. It is possible to freely change the combination of the delay elements according to the desired setting and realize the desired delay characteristics by that combination.

Specifically, as shown in FIG. 14, the replica circuit 16 according to the second embodiment comprises an adjustable delay device 160 including a plurality of gate delay elements 161-1 to 161-n connected in series as delay elements and a selector 162. The number of gate delay elements giving the desired delay value is selected by the selector 162.

The gate delay elements 161-1 to 161-n can each be configured by, for example as shown in FIG. 10, a buffer comprised of two inverters INV1 and INV2 connected in series or a NAND gate or NOR gate or a complex gate etc.

The selector 162 has connected to it an input line of a reference signal SIN and output nodes of the gate delay elements 161-1 to 161-n.

The replica circuit 16 including the adjustable delay device 160 is supplied with an adjustment signal SADJE and set to a desired value by a predetermined method for example after producing the chip.

Figure 15:
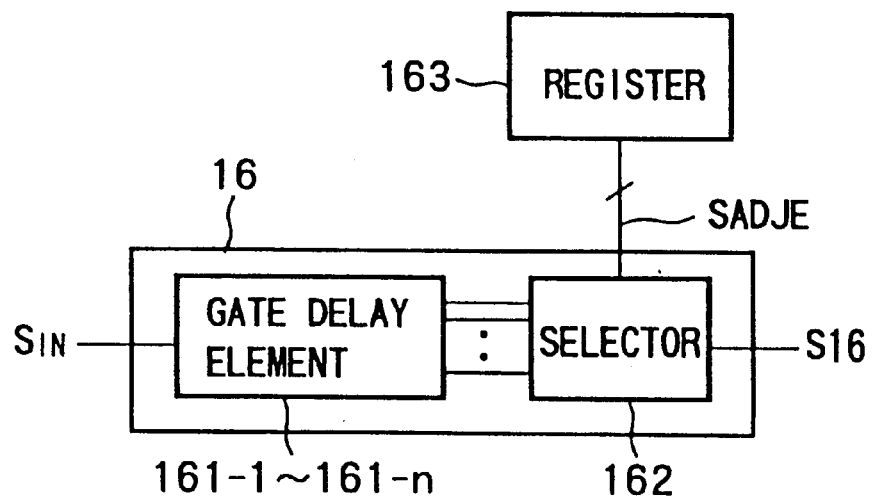
FIG. 15 is a circuit diagram of an example of the configuration for supplying an adjustment signal to a selector connected to an adjustable delay device according to the second embodiment.
Figure 16:
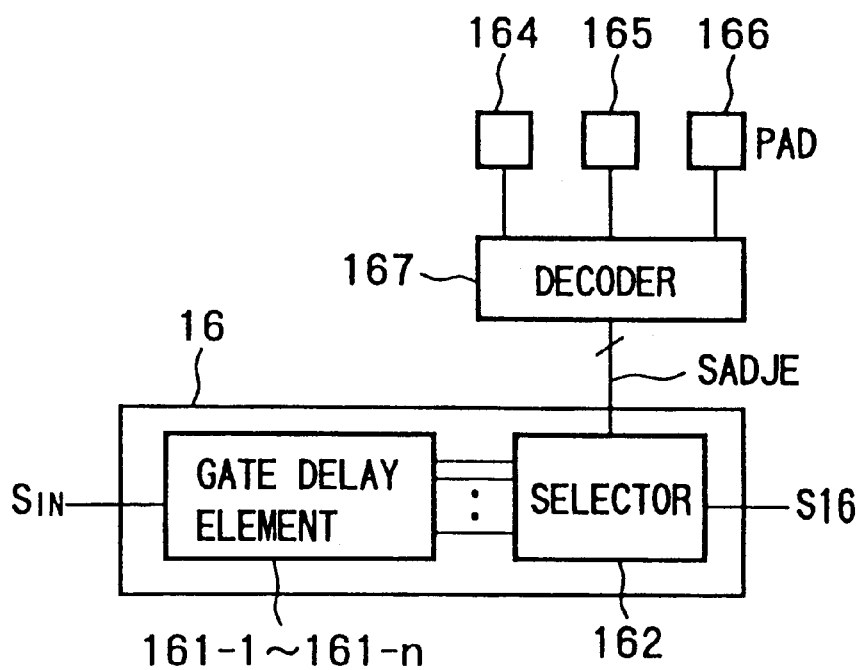
FIG. 16 is a circuit diagram of another example of the configuration for supplying an adjustment signal to a selector connected to an adjustable delay device according to the second embodiment.

The adjustment signal SADJE can be supplied by the configuration, for example, as shown in FIG. 15 or 16.

The configuration shown in FIG. 15 is an example of use of a register 163.

Namely, it is an example of a configuration of, for example, directly accessing the register 163 from the outside by DMA or setting delay value (gate output) data to be selected from some internal control circuit to give the adjustment signal SADJE.

The configuration shown in FIG. 16 is an example of controlling the selector 161 by setting signals in the external pins (input terminals of external signals) 164, 165, and 166 via a decoder 167.

Note that it is obvious that the present invention includes a case without the decoder 167. Also, it is not limited to the above examples of configurations.

In the semiconductor device 10A, the replica circuit 16 is comprised by an adjustable delay device.

For example, after producing the chip, the adjustment signal SADJE is supplied to the selector 162 of the replica circuit 16 via the register 163 or the decoder 167.

Due to this, the delay can be adjusted to a value enabling the replica system including the replica circuit 16 to reliably operate with a margin from the critical path delay of the semiconductor circuit (LSI) 11.

In the semiconductor device 10A adjusted in delay value in this way, a reference signal SIN of a predetermined cycle is input to the replica circuit 16. Then, the reference signal SIN is delayed by a predetermined time in the replica circuit 16 by gate processing etc., further delayed by the setting of the adjusted delay value, and output as a delay signal S16 to the phase comparator 13.

The phase comparator 13 receives as input the reference signal SIN and the output delay signal S16 and compares the phases of the two signals.

When the result of the comparison is that the delay signal S16 is delayed by one cycle or more from the reference signal S16, an up signal UP is generated and output to the charge pump 14.

When the result is that the delay signal S16 is advanced by one cycle or more from the reference signal SIN, a down signal DN is generated and output to the charge pump 14.

When the charge pump 14 receives the up signal UP from the phase comparator 13, it generates a signal S14 for instructing an increase of the power source voltage $V_{DD}$ by the DC-DC converter 15 and an increase of the processing speed (making the delay smaller) and outputs it to the DC-DC converter 15.

On the other hand, when receiving the down signal DN from the phase comparator 13, it generates a signal S14 for instructing a decrease of the power source voltage $V_{DD}$ by the DC-DC converter 15 and a reduction of the processing speed (make the delay larger) and outputs it to the DC-DC converter 15.

Then, the DC-DC converter 15, receiving the output signal S14 of the charge pump 14, adjusts the power source voltage $V_{DD}$ in value in accordance with the instruction of the signal S14 and supplies it to the semiconductor circuit 11 and the replica circuit 16.

As explained above, according to the second embodiment, since the replica circuit 16 is comprised of an adjustable delay device and the delay value of the delay device comprising the replica circuit 16 is adjustable to a value enabling the replica system including the replica circuit 16 to reliably operate with a margin from the critical path delay of the semiconductor circuit (LSI) 11 after, for example, producing the chip, an excessive margin can be prevented. Also, when the margin ends up smaller than expected, the margin can be increased to prevent erroneous operation.

Also, it is possible to configure a replica circuit able to be used generally and to flexibly set the operating voltage margin of the semiconductor circuit 11.

Furthermore, there is the advantage that by making it possible to change the delay value of the adjustable delay device comprising the replica circuit 16 by setting the register or external pins, it becomes possible to adjust the delay value and margin after producing a chip.

Third Embodiment

Figure 17:
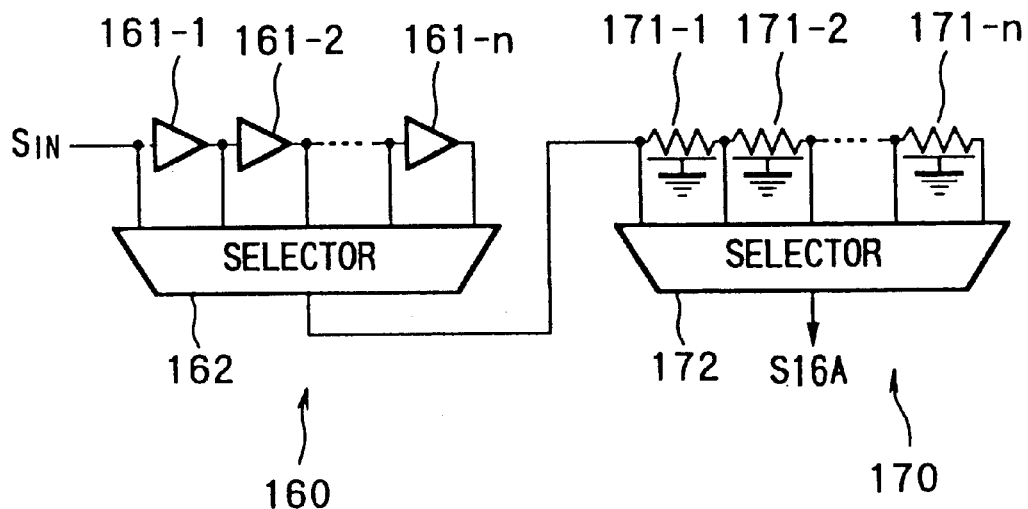
FIG. 17 is a view for explaining a semiconductor device according to a third embodiment of the present invention circuit and shows another example of the configuration of the replica circuit of a semiconductor device.

FIG. 17 is a view for explaining a semiconductor device according to a third embodiment of the present invention, specifically, a circuit diagram of another example of the configuration of a replica circuit of a semiconductor device.

The replica circuit according to the third embodiment differs from that of the above second embodiment in the point that an adjustable delay device 170 is connected in cascade after the adjustable delay device 160.

The delay device 170 comprises a plurality of RC delay elements 171-1 to 171-n connected in series and a selector 172. The number of RC delay elements giving the desired delay value is selected by the selector 172.

The RC delay elements 171-1 to 171-n are comprised by, for example, aluminum interconnections etc.

Also, the selector 172 has connected to it the output of the selector 162 of the earlier delay device 160 and the connection nodes of the RC delay elements 171-1 to 171-n.

Figure 18:
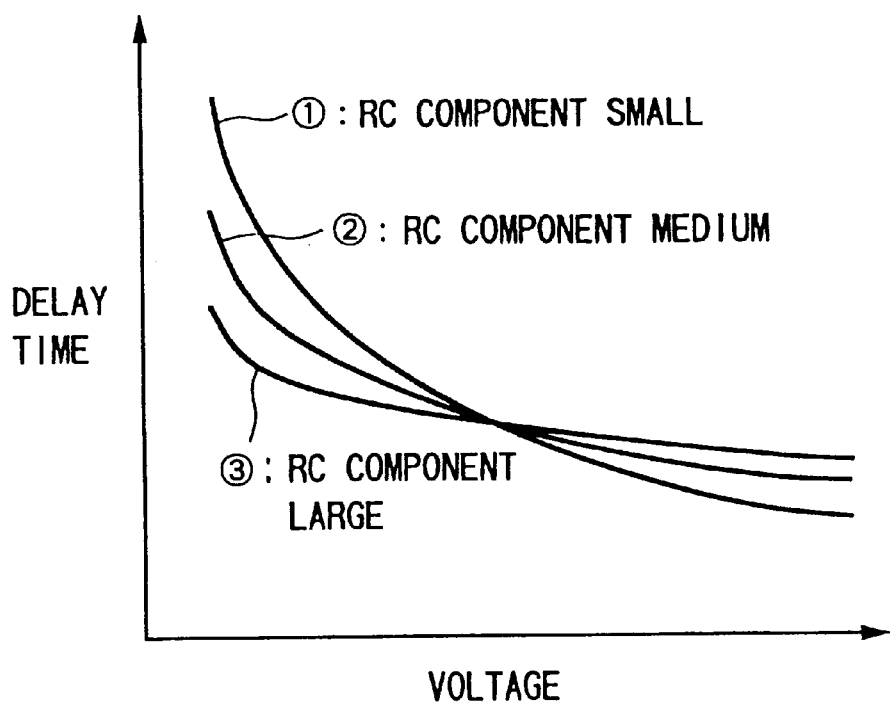
FIG. 18 is a view of the relationship of the ratio of the gate delay and RC delay and voltage delay characteristics.

FIG. 18 is a diagram of the relationship of the ratio of the gate delay and the RC delay and the voltage delay characteristic.

In FIG. 18, the curve indicated by ① is the voltage delay characteristic when the RC component is small, the curve indicated by ② is the voltage delay characteristic when the RC component is larger (when the RC component is intermediate in level) than the case of ①, and the curve indicated by ③ is the voltage delay characteristic when the RC component is larger than the case of ②.

As shown in FIG. 18, it is possible to obtain a desired voltage-delay characteristic by changing the ratio of the gate delay and the RC delay.

In the replica circuit 16A according to the third embodiment, the number of gate delay elements and RC delay elements giving the desired delay value and the desired ratio of the gate delay and the RC delay are respectively selected by the selector 162 and 172 under the control of, for example, the register and decoder.

According to the third embodiment, the same effects as in the above second embodiment can be obtained.

Note that, in the third embodiment, an example of the configuration of connecting an RC delay chain after a gate delay element chain was shown, however, the present invention is not limited to this positional relationship. Connection of a gate delay chain after an RC delay element chain is of course also included in the scope of the present invention.

Fourth Embodiment

Figure 19:
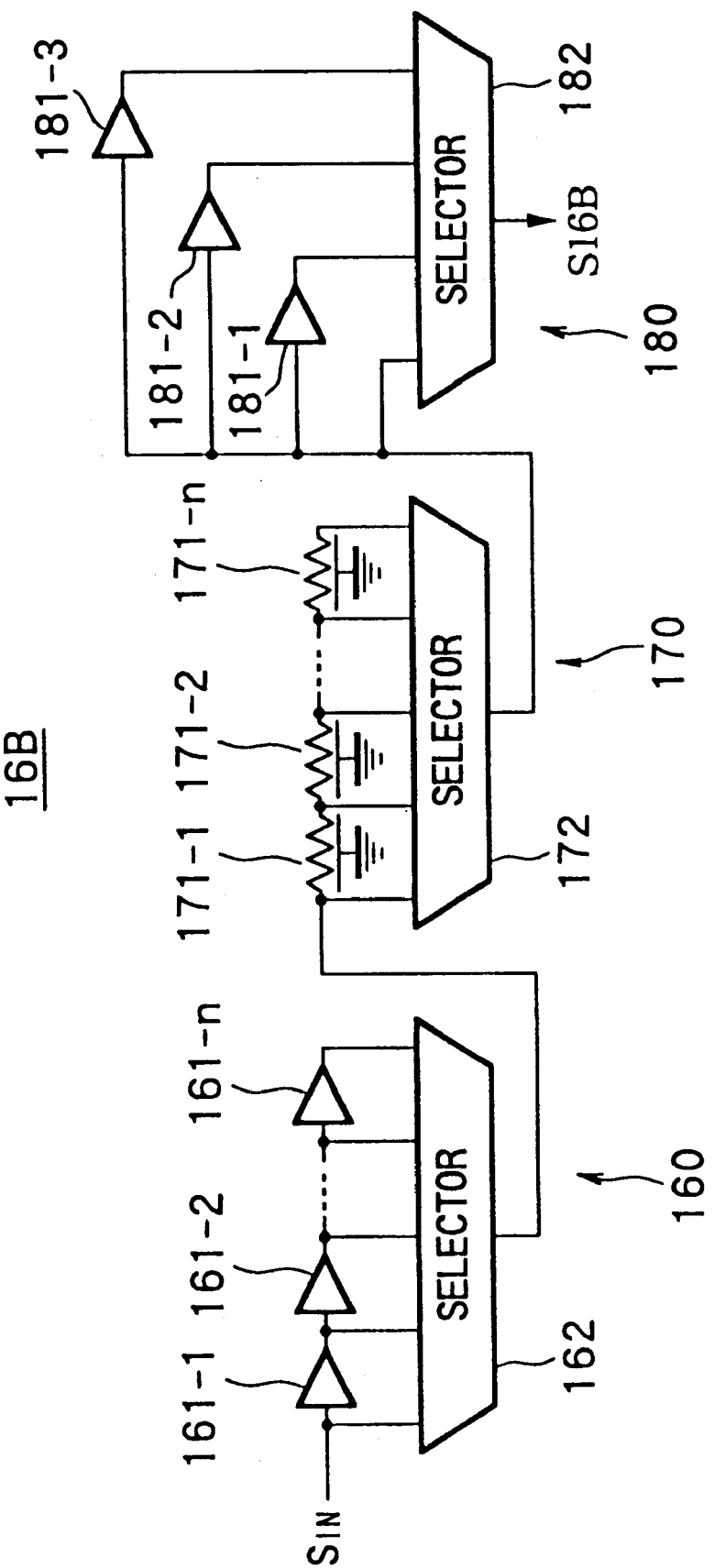
FIG. 19 is a view for explaining a semiconductor device according to a fourth embodiment of the present invention circuit and shows another example of the configuration of the replica circuit of a semiconductor device.

FIG. 19 is a view for explaining a semiconductor device according to a fourth embodiment of the present invention, specifically, is a circuit diagram of another example of the configuration of a replica circuit of the semiconductor device.

The replica circuit according to the fourth embodiment differs from that of the above third embodiment in the point that an adjustable delay device 180 is connected in cascade after the adjustable delay device 170.

The delay device 180 comprises a plurality of memory delay elements 181-1 to 181-3 having different load values arranged in parallel as component elements and a selector 182. The memory delay elements giving the desired delay value are selected by the selector 182.

The memory delay elements 181-1 to 181-n are, for example as shown in FIGS. 12A to 12C, configured to enable selection of values of loads changed using units emulating the discharge characteristics of bit lines.

Also, the selector 182 has connected to it the output of the selector 172 of the earlier delay device 170 and output nodes of the memory delay elements 181-1 to 181-n.

According to the fourth embodiment, the same effects as in the above third embodiment can be obtained.

Note that the fourth embodiment as well is not limited in the positional relationship of the gate delay element chain, RC delay element chain, and memory delay elements.

Fifth Embodiment

Figure 20:
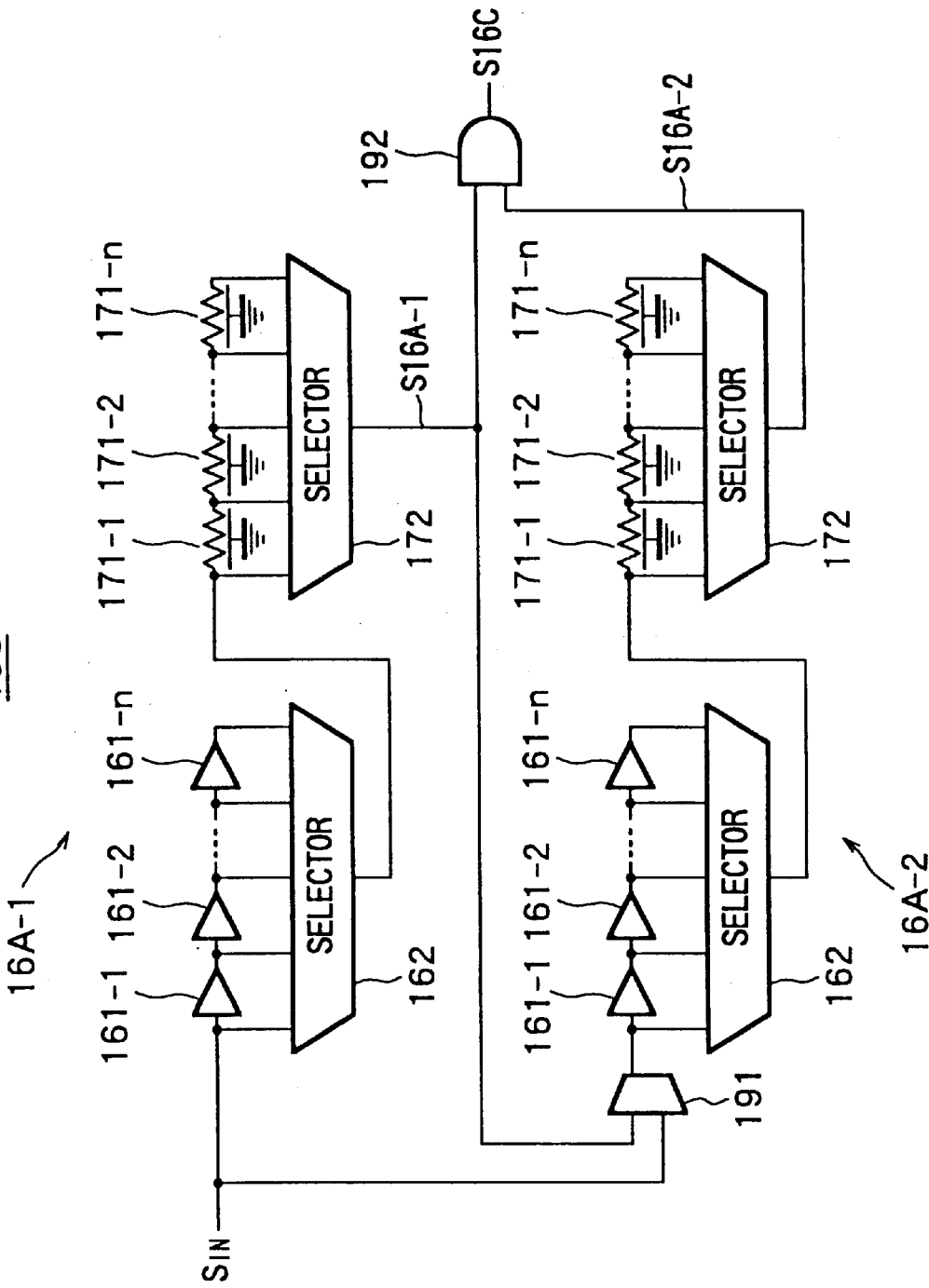
FIG. 20 is a view for explaining a semiconductor device according to a fifth embodiment of the present invention circuit and shows another example of the configuration of the replica circuit of a semiconductor device.

FIG. 20 is a view for explaining a semiconductor device according to a fifth embodiment of the present invention, specifically, is a circuit diagram of another example of the configuration of a replica circuit of the semiconductor device.

The replica circuit according to the fifth embodiment differs from the replica circuit according to the third embodiment in the point that two replica portions 16A-1 and 16A-2 each comprised of gate delay elements and RC delay elements connected in cascade as delay components are connected in parallel or in cascade to an input of the reference signal SIN via a selector 191 serving as a connection selecting means and outputs of the two replica portions 16A-1 and 16A-2 are used to obtain a replica output S16C via an AND gate 192 serving as a selecting means.

The AND gate 192 serving as the selecting means selects and outputs an output signal of the delay device of a larger delay amount from the plurality of outputs of the replica portions as a monitoring signal, that is, the delay signal S16C.

Also, the replica portions 16A-1 and 16A-2 can be independently set in the number of gate delay elements and the number of RC delay elements.

In the above configuration, when the selector 191 selects the replica input, that is, the reference signal SIN, the two replica portions 16A-1 and 16A-2 operate in parallel.

This parallel operation is suitable for the following case:

Namely, when the critical path of the semiconductor circuit (LSI) 11 body is changed due to the operating voltage, a discontinuity occurs in the voltage-delay characteristic of the LSI.

In such a case, it becomes difficult to achieve optimal tracking of the voltage-delay characteristic of the LSI by one replica circuit.

Therefore, by combining the two prepared replica portions 16A-1 and 16A-2 to match the respective critical paths, it becomes possible to make the voltage-delay characteristic of the replica circuit optimally match the characteristic of the LSI.

Also, when the selector 191 selects an output signal S16A-1 of the replica portion 16A-1, the two replica portions 16A-1 and 16A-2 are connected in series (cascade) and operate as one replica circuit.

Connection in series for operating as one replica circuit is suitable for the following case:

Namely, when the critical path of the LSI is configured as a gate+long interconnection+gate+long interconnection (for example, when a repeater buffer is inserted to a long interconnection), by connecting two replica portions in series and independently setting the number of gate delay elements and the number of RC delay elements by the respective replica portions, it becomes possible to make a replica circuit close to the configuration of the critical path of the LSI.

Also, it becomes possible to double the range of settings of the gate delay component and the RC delay component.

As explained above, according to the fifth embodiment, in addition to the effects of the above third embodiment, it is possible to obtain the effect of making the replica circuit close to the configuration of the critical path of the LSI.

Note that in FIG. 20, an example of using two of the replica circuits shown in FIG. 17 according to the third embodiment was explained, however needless to say the same effects can be obtained by using replica circuits shown in FIG. 19 according to the fourth embodiment.

Sixth Embodiment

Figure 21:
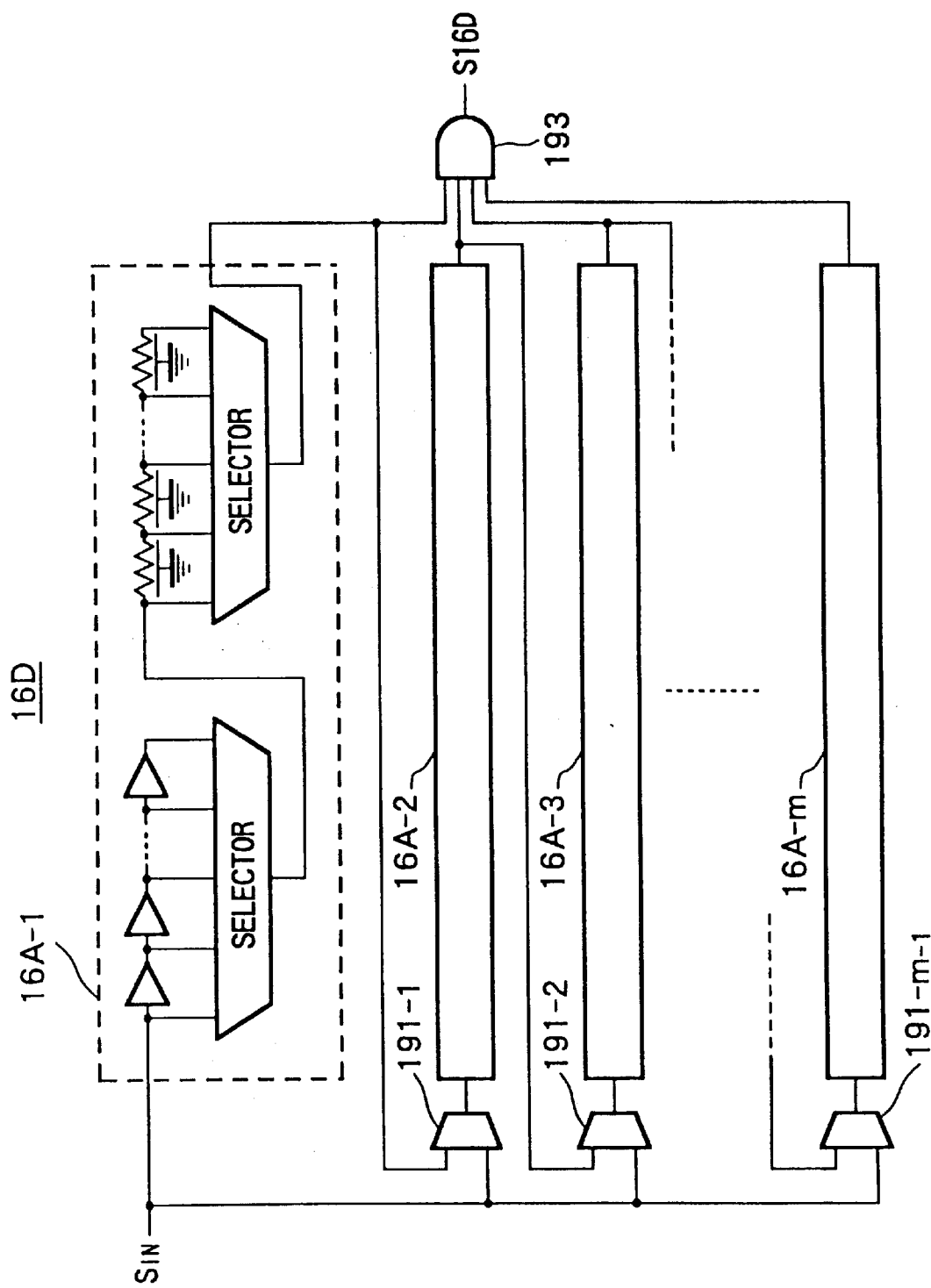
FIG. 21 is a view for explaining a semiconductor device according to a sixth embodiment of the present invention circuit and shows another example of the configuration of the replica circuit of a semiconductor device.

FIG. 21 is a view for explaining a semiconductor device according to a sixth embodiment of the present invention, specifically, a circuit diagram of another example of the configuration of a replica circuit of the semiconductor device.

The replica circuit according to the sixth embodiment differs from the replica circuit according to the above fifth embodiment in the point that it uses m (m≧3) number of replica portions each comprised by gate delay elements and RC delay elements as cascade connected delay elements, connects the replica portions 16A-1 to 16A-m in parallel or in series (cascade) to an input of the reference signal SIN via selectors 191-1 to 191-m−1 for parallel or serial operation, and thereby selects the outputs of the m number of replica portions 16A-1 to 16A-m to obtain the desired replica output, that is, the delay signal S16D, via an m-input AND gate 193 serving as a selecting means.

According to the sixth embodiment, the same effects can of course be obtained as in the above fifth embodiment. Moreover, it becomes possible to configure a plurality of replica portions of a gate+long interconnection+gate+long interconnection+ . . . and to deal with characteristics having discontinuities by operating them in parallel.

Note that, in FIG. 21, an example of using m number of replica circuits shown in FIG. 17 according to the third embodiment was explained, however, needless to say the same effects can be obtained by using replica circuits shown in FIG. 19 according to the fourth embodiment.

Seventh Embodiment

Figure 22:
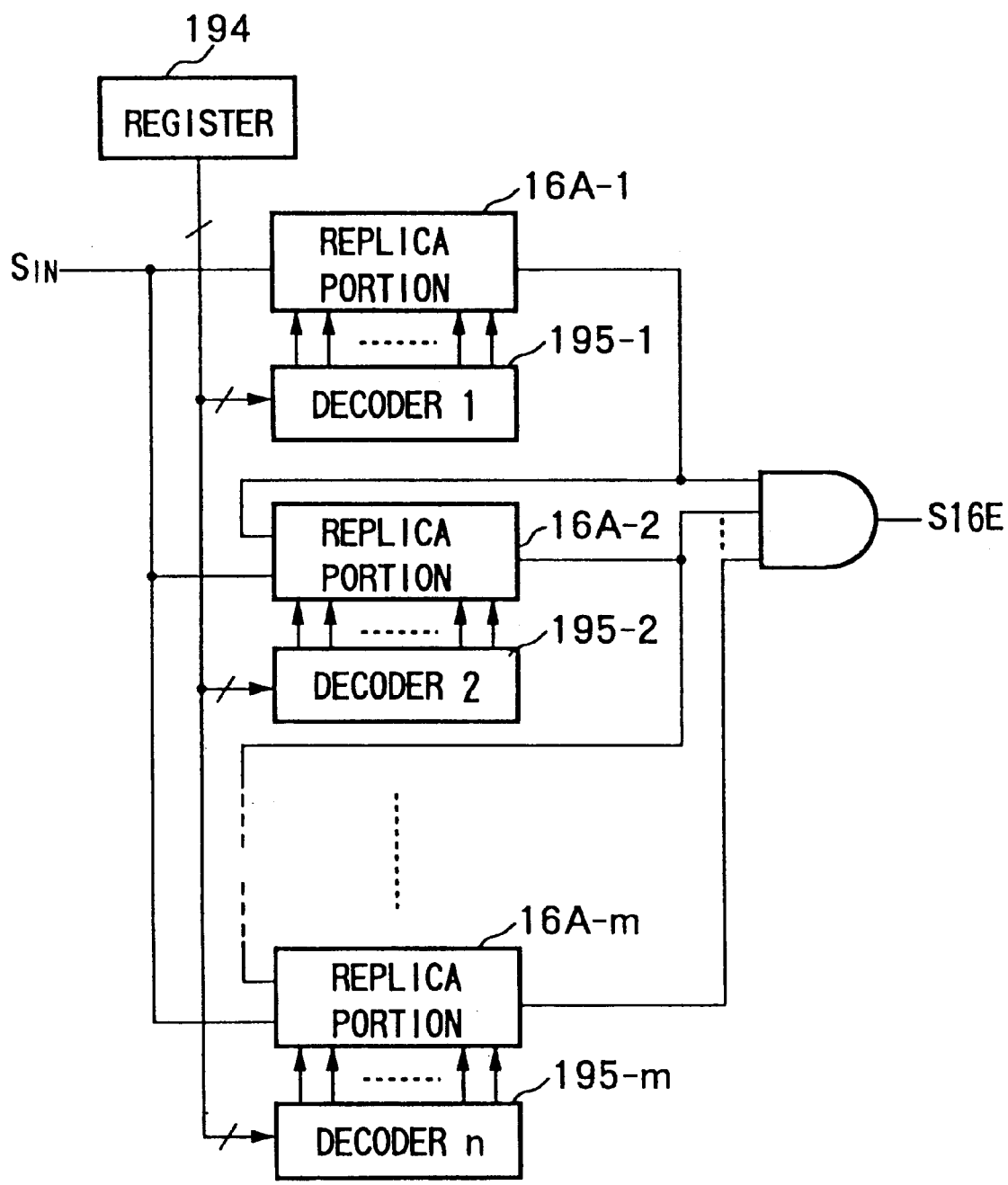
FIG. 22 is a view for explaining a semiconductor device according to a seventh embodiment of the present invention circuit and shows an example of the configuration enabling a change of a delay value of an adjustable replica circuit group using a register.

FIG. 22 is a view for explaining a semiconductor device according to a seventh embodiment of the present invention, specifically, a circuit diagram of another example of the configuration of a replica circuit of a semiconductor device.

In the seventh embodiment, a specific example of a configuration where a group of adjustable replica circuits are able to be set to a desired value after producing a chip is shown.

FIG. 22 is a circuit diagram of an example of the configuration enabling a change of the delay value of the group of adjustable replica circuits by using a register.

In this circuit, the number of delay elements and connection methods are selected by a selector as shown in the above second to sixth embodiments. These are set by a register 194.

The information set in the register 194 is decoded by decoders 195-1 to 195-m provided corresponding to the respective replica portions 16A-1 to 16A-m and supplied to the selector.

The register 194 may be directly accessed from the outside by DNA or set by some internal control circuit.

Note that the setting of the delay value of the replica circuit can be controlled without using the register as shown in FIG. 22 but by setting signals in the external pins, for example, as shown in FIGS. 7 and 17.

Eighth Embodiment

Figure 23:
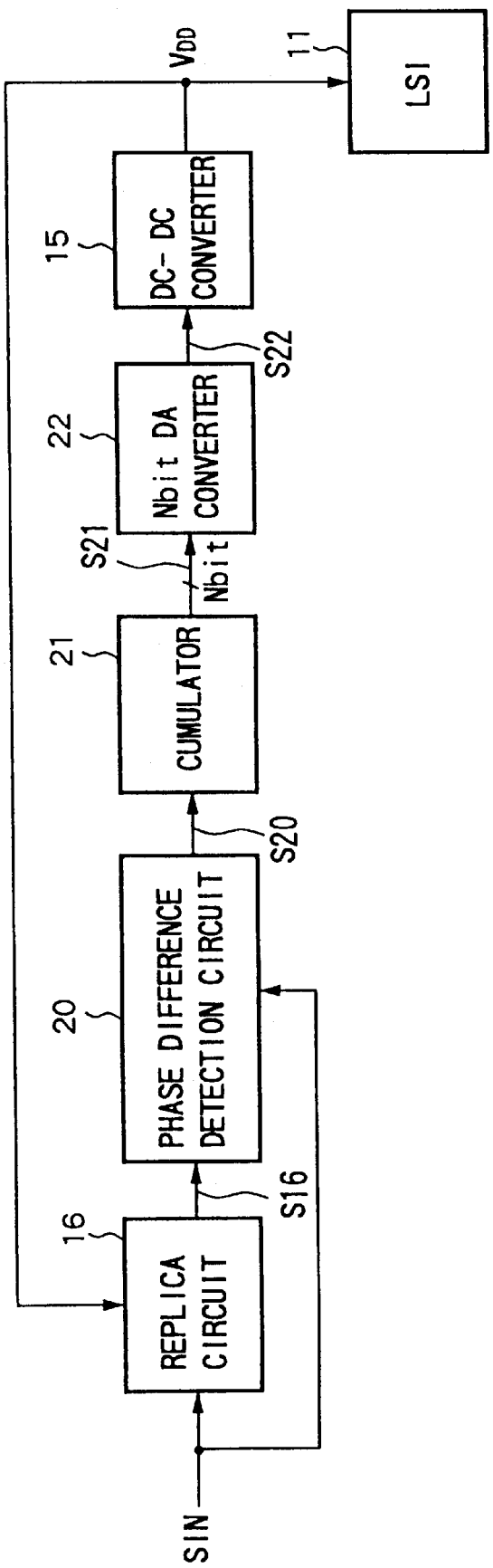
FIG. 23 is a block diagram of an eighth embodiment of a semiconductor device using a replica circuit according to the present invention.

FIG. 23 is a block diagram of an eighth embodiment of a semiconductor device using a replica circuit according to the present invention.

The eighth embodiment differs from the second to the seventh embodiments in the point that instead of using a phase comparator for outputting an up signal and a down signal and a charge pump to output a signal in accordance with the up signal and the down signal, a phase difference detection circuit 20 is provided for comparing the phases of the reference signal SIN and the output delay signal S16 of the replica circuit 16 including the delay device and outputting a digital phase difference information signal S20 corresponding to the amount of difference, a cumulator 21 is provided for receiving and cumulatively adding the phase difference information signal S20 and output N-bit signal S20 to instruct adjustment of the power source voltage $V_{DD}$, and an N-bit DA (digital-analog) converter 22 is provided for converting the N-bit signal S21 from a digital signal to an analog signal and supplying it to the DC-DC converter 15.

Note that the replica circuit 16 may be configured as shown in FIGS. 14, 17, 19, 20, 21 and 22.

Also, the configuration of use of the phase difference detection circuit 20, cumulator 21, and DA converter 22 as in FIG. 23 may also be applied to the configuration of arrangement of the delay device 12A outside the replica circuit 12 as in the first embodiment shown in FIG. 3.

According to the eighth embodiment, the same effects as the above embodiments can be obtained.

Ninth Embodiment

FIG. 24 is a block diagram of a ninth embodiment a semiconductor device using a replica circuit according to of the present invention.

The ninth embodiment differs from the above eighth embodiment in the point that a processor 23 is used instead of the cumulator 21.

In this case, the difference between the setting, set to any value by for example a program, and a phase difference information signal S20 is output as an N-bit signal S23 for instructing adjustment of the power source voltage $V_{DD}$.

According to the ninth embodiment, the same effects can be obtained as in the above embodiments.

Summarizing the effects of the present invention, as explained above, according to the present invention, by providing an adjustable delay device, an excessive margin can be prevented and, when a margin ends up smaller than expected, the margin can be increased to prevent erroneous operation.

Also, according to the present invention, by providing a replica circuit capable of being freely set in delay value by combinations of the delay elements, a general-use replica circuit can be configured, and at the same time, it becomes possible to flexibly set a margin of operating voltage of a semiconductor circuit.

Furthermore, since the delay adjustment device is comprised by delay elements having different delay characteristics, by adjusting the delay value and characteristic by them, it is possible to prevent the inability of tracking due to changes of the voltage or temperature.

Also, by enabling a change of the adjustable delay device by inputting an external signal to a register or input terminals, it becomes possible to adjust the delay value and margin after producing a chip.

Furthermore, by using delay elements having different delay characteristics as standard cells and arranging and configuring a replica circuit and delay adjustment unit by the standard cells, there is the advantage of making the design work more efficient.

Also, by preparing a plurality of replica portions and enabling selection of parallel operation, serial operation, or parallel/serial operation of these portions, it becomes possible to make a replica circuit close to the configuration of the critical path of the semiconductor circuit.

While the invention has been described with reference to specific embodiment chosen for purpose of illustration, it should be apparent that numerous modifications could be made thereto by those skilled in the art without departing from the basic concept and scope of the invention.

What is claimed is:

1. A semiconductor device comprising:
   a semiconductor circuit having a transfer path,
   a replica circuit for monitoring a delay time of a critical path of said semiconductor circuit, and
   an adjustable delay device arranged at least at one of an input side and an output side of said replica circuit and capable of being adjusted in its delay value, wherein said adjustable delay device includes delay elements having different delay characteristics, and wherein said different delay characteristics of the delay elements include a transistor gate delay characteristic, wiring resistance and wiring capacity delay characteristic, and memory delay characteristic.

2. A semiconductor device as set forth in claim 1, further comprising:
   a register and
   a means for adjusting a delay value of said adjustable delay device based on data set in said register.

3. A semiconductor device as set forth in claim 1, further comprising:
   an input terminal of an external signal and
   a means for adjusting a delay value of said adjustable delay device based on an external signal input to said input terminal.

4. A semiconductor device as set forth in claim 1, wherein said delay elements having different delay characteristics are used as standard cells and wherein at least one of said adjustable delay device and replica circuit is configured by arrangements of the standard cells of the delay elements.

5. A semiconductor device comprising:
   a semiconductor circuit having a transfer path,
   a replica circuit configured by a circuit having an equivalent power source voltage-delay characteristic to that of a transfer path used as a critical path of said semiconductor circuit and propagating a reference signal to replicate the critical path of said semiconductor device,
   an adjustable delay device arranged at least at one of an input side and output side of said replica circuit and capable of being adjusting in its delay value, and
   a voltage control circuit for generating a power source voltage of a value based on monitoring results of said replica circuit and supplying the same to said semiconductor circuit and said replica circuit, wherein said different delay characteristics of the delay elements include a transistor gate delay characteristic, wiring resistance and wiring capacity delay characteristic, and memory delay characteristic.

6. A semiconductor device as set forth in claim 5, wherein said adjustable delay device comprises delay elements having different delay characteristics.

7. A semiconductor device as set forth in claim 5, further comprising:
   a register and
   a means for adjusting a delay value of said adjustable delay device based on data set in said register.

8. A semiconductor device as set forth in claim 6, further comprising:
   a register and
   a means for adjusting a delay value of said adjustable delay device based on data set in said register.

9. A semiconductor device as set forth in claim 5, further comprising:
   an input terminal of an external signal and
   a means for adjusting a delay value of said adjustable delay device based on an external signal input to said input terminal.

10. A semiconductor device as set forth in claim 6, further comprising:
    an input terminal of an external signal and
    a means for adjusting a delay value of said adjustable delay device based on an external signal input to said input terminal.

11. A semiconductor device as set forth in claim 6, wherein said delay elements having different delay characteristics are used as standard cells and wherein at least one of said adjustable delay device and replica circuit is configured by arrangements of the standard cells of the delay elements.

12. A semiconductor device as set forth in claim 8, wherein said delay elements having different delay characteristics are used as standard cells and wherein at least one of said adjustable delay device and replica circuit is configured by arrangements of the standard cells of the delay elements.

13. A semiconductor device as set forth in claim 10, wherein said delay elements having different delay characteristics are used as standard cells and wherein at least one of said adjustable delay device and replica circuit is configured by arrangements of the standard cells of the delay elements.

14. A semiconductor device comprising:
    a semiconductor circuit having a transfer path and
    a replica circuit for replicating a delay time of a critical path of said semiconductor circuit,
    said replica circuit comprising an adjustable delay device capable of being adjusted in its delay time, wherein said adjustable delay device comprises delay elements having different delay characteristics, and wherein said different delay characteristics of the delay elements include a transistor gate delay characteristic, wiring resistance and wiring capacity delay characteristic, and memory delay characteristic.

15. A semiconductor device as set forth in claim 14, further comprising:
    a register and
    a means for adjusting a delay value of said adjustable delay device based on data set in said register.

16. A semiconductor device as set forth in claim 14, further comprising:
    an input terminal of an external signal and
    a means for adjusting a delay value of said adjustable delay device based on an external signal input to said input terminal.

17. A semiconductor device comprising:

a semiconductor device having a transfer path and a replica circuit for propagating a reference signal to replicate a delay time of a critical path of said semiconductor circuit, said replica circuit comprising:

a plurality of replica portions including delay devices, a connection selecting means for connecting said plurality of replica portions in parallel or in series with respect to an input of said reference signal upon receiving a selection signal, and a selecting means for selecting as a monitor signal an output signal of the largest delay amount from outputs of said plurality of replica portions, wherein said different delay characteristics of the delay elements include a transistor gate delay characteristic, wiring resistance and wiring capacity delay characteristic, and memory delay characteristic.

18. A semiconductor device as set forth in claim 17, wherein said delay devices comprise delay elements having different delay characteristics and are capable of being adjusted in delay values by settings.

19. A semiconductor device as set forth in claim 17, further comprising:

a register, the connection selecting means connecting the plurality of replica portions in parallel or in series based on data set in said register.

20. A semiconductor device as set forth in claim 18, further comprising:

a register, the connection selecting means connecting the plurality of replica portions in parallel or in series based on data set in said register.

21. A semiconductor device as set forth in claim 18, further comprising:

a register and a means for adjusting a delay value of an adjustable delay device based on data set in said register.

22. A semiconductor device as set forth in claim 20, further comprising:

a register and a means for adjusting a delay value of an adjustable delay device based on data set in said register.

23. A semiconductor device as set forth in claim 17, further comprising an input terminal of an external signal, said connection selecting means connecting said plurality of replica portions in parallel or in series based on the external signal input to said input terminal.

24. A semiconductor device as set forth in claim 18, further comprising an input terminal of an external signal, said connection selecting means connecting said plurality of replica portions in parallel or in series based on an external signal input to said input terminal.

25. A semiconductor device as set forth in claim 18, further comprising:

an input terminal of an external signal and a means for adjusting a delay value of an adjustable delay device based on an external signal input to said input terminal.

26. A semiconductor device as set forth in claim 24, further comprising:

an input terminal of an external signal and a means for adjusting a delay value of an adjustable delay device based on an external signal input to said input terminal.

27. A semiconductor device comprising:

a semiconductor circuit having a transfer path, a replica circuit having an equivalent power source voltage-delay characteristic to that of a transfer path used as a critical path of said semiconductor circuit, configured by an adjustable delay device capable of being adjusted in its delay value, and propagating a reference signal representative of the critical path of said semiconductor device, and a voltage control circuit for generating a power source voltage of a value based on results of said replica circuit and supplying it to said semiconductor circuit and said replica circuit, wherein said different delay characteristics of the delay elements include a transistor gate delay characteristic, wiring resistance and wiring capacity delay characteristic, and memory delay characteristic.

28. A semiconductor device as set forth in claim 27, wherein said adjustable delay device comprises delay elements having different delay characteristics.

29. A semiconductor device as set forth in claim 27, further comprising:

a register and a means for adjusting a delay value of said adjustable delay device based on data set in said register.

30. A semiconductor device as set forth in claim 28, further Comprising:

a register and a means for adjusting a delay value of said adjustable delay device based on data set in said register.

31. A semiconductor device as set forth in claim 27, further comprising:

an input terminal of an external signal and a means for adjusting a delay value of said adjustable delay device based on an external signal input to said input terminal.

32. A semiconductor device as set forth in claim 28, further comprising:

an input terminal of an external signal and a means for adjusting a delay value of said adjustable delay device based on an external signal input to said input terminal.

33. A semiconductor device comprising:

a semiconductor circuit having a transfer path, a replica circuit comprising a plurality of replica portions each having an equivalent power source voltage-delay characteristic to that of a transfer path used as a critical path of said semiconductor circuit and including a delay device, a connection selecting means for connecting said plurality of replica portions in parallel on in series with respect to an input of said reference signal upon receiving a selection signal, and a selecting means for selecting an output signal of the largest delay amount from outputs of said plurality of replica portions, for propagating the reference signal to replicate the critical path of said semiconductor device, and a voltage control circuit for generating a power source voltage of a value based on monitoring results of said replica circuit and supplying the same to said semiconductor circuit and said replica circuit, wherein said different delay characteristics of the delay elements include a transistor gate delay characteristic, wiring resistance and wiring capacity delay characteristic, and memory delay characteristic.

34. A semiconductor device as set forth in claim 33, wherein each said delay device comprises delay elements having different delay characteristics and is capable of being adjusted in its delay value by settings.

35. A semiconductor device as set forth in claim 33, further comprising:

a register, the connection selecting means connecting the plurality of replica portions in parallel or in series based on data set in said register.

36. A semiconductor device as set forth in claim 34, further comprising:

a register, the connection selecting means connecting the plurality of replica portions in parallel or in series based on data set in said register.

37. A semiconductor device as set forth in claim 34, further comprising:

a register and a means for adjusting a delay value of an adjustable delay device based on data set in said register.

38. A semiconductor device as set forth in claim 36, further comprising:

a register and a means for adjusting a delay value of an adjustable delay device based on data set in said register.

39. A semiconductor device as set forth in claim 33, further comprising:

an input terminal of an external signal, said connection selecting means connecting said plurality of replica portions in parallel or in series based on an external signal input to said input terminal.

40. A semiconductor device as set forth in claim 34, further comprising:

an input terminal of an external signal, said connection selecting means connecting said plurality of replica portions in parallel or in series based on an external signal input to said input terminal.

41. A semiconductor device as set forth in claim 34, further comprising:

an input terminal of an external signal and a means for adjusting a delay value of an adjustable delay device based on an external signal input to said input terminal.

42. A semiconductor device as set forth in claim 40, further comprising:

an input terminal of an external signal and a means for adjusting a delay value of an adjustable delay device based on an external signal input to said input terminal.

* * * * *

UNITED STATES PATENT AND TRADEMARK OFFICE
CERTIFICATE OF CORRECTION

PATENT NO.     : 6,414,527 B1                               Page 1 of 1
DATED          : July 2, 2002
INVENTOR(S)    : Katsunori Seno et al.

It is certified that error appears in the above-identified patent and that said Letters Patent is hereby corrected as shown below:

Column 20,
Line 31, replace "Comprising" with -- comprising --.

Signed and Sealed this

Seventh Day of October, 2003

JAMES E. ROGAN
*Director of the United States Patent and Trademark Office*